(12) United States Patent
Yu et al.

(10) Patent No.: US 7,458,009 B2
(45) Date of Patent: Nov. 25, 2008

(54) METHOD FOR ENCODING LOW-DENSITY PARITY CHECK CODE

(75) Inventors: Nam-Yul Yu, Suwon-si (KR); Min-Goo Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 221 days.

(21) Appl. No.: 10/563,216

(22) PCT Filed: Oct. 14, 2004

(86) PCT No.: PCT/KR2004/002630

§ 371 (c)(1),
(2), (4) Date: Jun. 30, 2006

(87) PCT Pub. No.: WO2005/036758

PCT Pub. Date: Apr. 21, 2005

(65) Prior Publication Data

US 2007/0022354 A1    Jan. 25, 2007

(30) Foreign Application Priority Data

Oct. 14, 2003 (KR) .................... 10-2003-0071456

(51) Int. Cl.
*G06F 11/00* (2006.01)
(52) U.S. Cl. .................................... 714/800
(58) Field of Classification Search ................ 714/800, 714/801, 807
See application file for complete search history.

(56) References Cited

U.S. PATENT DOCUMENTS 6,633,856 B2   10/2003   Richardson et al.

7,178,080 B2 *  2/2007   Hocevar ..................... 714/752
2002/0042899 A1  4/2002   Macros et al.

(Continued)

FOREIGN PATENT DOCUMENTS

JP    2001-168733    6/2001

(Continued)

OTHER PUBLICATIONS

Hocevar, Dale E. "LDPC Code Construction with Flexible Hardware Implementation" ICC 2003. 2003 IEEE International Conference on Communications. Anchorage, AK, May 11-15, 2003; *IEEE International Conference on Communications*, New York, NY, vol. 1 of 5, May 11, 2003, pp. 2708-2712.

(Continued)

*Primary Examiner*—Shelly A Chase
(74) *Attorney, Agent, or Firm*—Roylance, Abrams, Berdo & Goodman, LLP

(57) ABSTRACT

An apparatus and method for encoding low-density parity check (LDPC) codes. The method for generating a low-density parity check code formed of an information-part matrix and a parity-part matrix comprises the steps of converting the information-part matrix into an array code structure and assigning a degree sequence to each submatrix column; extending a dual-diagonal matrix corresponding to the parity-part matrix such that an offset value between diagonals has a random value; lifting the normalized dual-diagonal matrix; determining an offset value for cyclic column shift for each submatrix of the lifted normalized dual-diagonal matrix; and determining a parity symbol corresponding to a column of the parity-part matrix.

9 Claims, 23 Drawing Sheets

U.S. PATENT DOCUMENTS

2004/0153934 A1    8/2004    Jin et al.

FOREIGN PATENT DOCUMENTS

| JP | 2003-198383 | 7/2003 |
| JP | 2004-088468 | 3/2004 |
| KR | 2003-0036227 | 5/2003 |
| WO | WO 2004-0777333 A2 | 9/2004 |

OTHER PUBLICATIONS

Echard, R. et al. "Deterministic π-rotation Low Density Parity Check Codes" *Electronics Letters, IEE* Stevenage, GB, vol. 38, No. 10, May 9, 2002, pp. 464-465.

Echard, Rich et al. "Irregular π-rotation LDPC Codes" Globecom '02. 2002—*IEEE Global Telecommunications Conference*. Conference Proceedings. Taipei, Taiwan, Nov. 17-21, 2002, *IEEE Global Telecommunications Conference*, New York, NY, vol. 1 of 3, Nov. 17, 2002, pp. 1274-1278.

Yi, Yu et al. "Design of Semi-Algebraic Low-Density Parity-Check (SA-LDPC) Codes for Multilevel Coded Modulation" Parallel and Distributed Computing, Applications and Technologies, 2003. PDCAT 2003. Proceedings of the Fourth International Conference on Aug. 27-29, 2003, Piscataway, NJ, USA, IEEE, Aug. 27, 2003, pp. 931-934.

Haley, David et al. "Iterative Encoding of Low-Density Parity-Check Codes" Globecom '02. 2002—*IEEE Global Telecommunications Conference*. Conference Proceedings. Taipei, Taiwan, Nov. 17-21, 2002, *IEEE Global Telecommunications Conference*, New York, NY, vol. 1 of 3, Nov. 17, 2002, pp. 1289-1293.

\* cited by examiner $$H = \begin{bmatrix} I & I & I & \cdots\cdots & I \\ I & \sigma^1 & \sigma^2 & \cdots\cdots & \sigma^{p-1} \\ I & \sigma^2 & \sigma^4 & \cdots\cdots & \sigma^{2(p-1)} \\ & & & & \\ I & \sigma^{r-1} & \sigma^{2(r-1)} & \cdots\cdots & \sigma^{(r-1)(p-1)} \end{bmatrix}$$

| 0 | 0 | 0  | 0  |    | 0  |    |    | 0  |    |
|---|---|----|----|----|----|----|----|----|----|
| 0 | 1 | 2  | 3  |    | 6  |    |    | 11 |    |
| 0 | 2 | 4  | 6  |    | 12 |    |    | 22 |    |
| 0 | 3 | 6  | 9  |    | 18 |    |    | 33 |    |
| 0 | 4 | 8  | 12 |    |    | 28 |    |    | 48 |
| 0 | 5 | 10 |    | 20 |    | 35 |    |    | 60 |
| 0 | 6 | 12 |    | 24 |    | 42 |    |    | 72 |
| 0 | 7 | 14 |    | 28 |    |    | 56 |    | 2  |
| 0 | 8 | 16 |    | 32 |    |    | 64 |    | 15 |
| 0 | 9 | 18 |    | 36 |    |    | 72 |    | 28 |
| 0 | 10| 20 |    |    | 50 |    | 1  |    | 51 |
| 0 | 11| 22 |    |    | 55 |    | 10 |    | 65 |
| 0 | 12| 24 |    |    | 60 |    | 19 |    | 79 |
| 0 | 13| 26 |    |    | 65 |    |    | 41 |    |
| 0 | 14| 28 |    |    | 70 |    |    | 51 |    |

Example of $H_d$ with irregular distribution of $d_v = 15$ (p=89)

FIG.7

$$H_P = \begin{bmatrix} \sigma^{j_0} & & & & \sigma^{j_1} & & \\ & \sigma^{j_2} & & & & \sigma^{j_3} & \\ & & \ddots & & & & \ddots \\ & & & \sigma^{j_{2(r-f-1)}} & & & & \sigma^{j_{2(r-f-1)+1}} \\ \sigma^{j_{2(r-f)+1}} & & & & \sigma^{j_{2(r-f)}} & & \\ & \ddots & & & & \ddots & \\ & & \sigma^{j_{2(r-1)+1}} & & & & \sigma^{j_{2(r-1)}} \end{bmatrix}$$

fsub-matrix columns (pxf columns)

FIG. 9

Example of $H_p$ by lifting the generalized dual-diagonal matrix ($r$=15, $f$=7, $p$=89)

−$H_d$

| 0 | 0 | 0 | 0 |    | 0  |    | 0  |    |
|---|---|---|---|----|----|----|----|----|
| 0 | 1 | 2 | 3 |    | 6  |    | 11 |    |
| 0 | 2 | 4 | 6 |    | 12 |    | 22 |    |
| 0 | 3 | 6 | 9 |    | 18 |    | 4  |    |
| 0 | 4 | 8 | 12|    | 28 |    | 19 |    |
| 0 | 5 | 10|   | 20 | 6  |    | 2  |    |
| 0 | 6 | 12|   | 24 | 13 |    | 14 |    |
| 0 | 7 | 14|   | 28 |    | 27 | 4  |    |
| 0 | 8 | 16|   | 3  |    | 6  | 17 |    |
| 0 | 9 | 18|   | 7  |    | 14 | 1  |    |
| 0 | 10| 20|   | 21 |    | 3  |    | 24 |
| 0 | 11| 22|   | 26 |    | 12 |    | 9  |
| 0 | 12| 24|   | 2  |    | 21 |    | 23 |
| 0 | 13| 26|   | 7  |    |    | 14 |    |
| 0 | 14| 28|   | 12 |    |    | 24 |    |

| | | | | | | | | | |
|---|---|---|---|---|---|---|---|---|---|
| 0 | 0 | 0 | 0 | | 0 | | 0 | | |
| 0 | 1 | 2 | 3 | | 6 | | 11 | | |
| 0 | 2 | 4 | 6 | | 12 | | 22 | | |
| 0 | 3 | 6 | 9 | | 18 | | 33 | | |
| 0 | 4 | 8 | 12 | | 28 | | | 48 | |
| 0 | 5 | 10 | | 20 | 35 | | | 7 | |
| 0 | 6 | 12 | | 24 | 42 | | | 19 | |
| 0 | 7 | 14 | | 28 | | 3 | | | 38 |
| 0 | 8 | 16 | | 32 | | 11 | | | 51 |
| 0 | 9 | 18 | | 36 | | 19 | | | 11 |
| 0 | 10 | 20 | | | 50 | | 37 | | 34 |
| 0 | 11 | 22 | | | 2 | | 46 | | 48 |
| 0 | 12 | 24 | | | 7 | | 2 | | 9 |
| 0 | 13 | 26 | | | 12 | | | 24 | |
| 0 | 14 | 28 | | | 17 | | | 34 | |

| | | | | | | | |
|---|---|---|---|---|---|---|---|
| 0 | 0 | 0 | 0 |  | 0 |  | 0 |
| 0 | 1 | 2 | 3 |  | 6 |  | 11 |
| 0 | 2 | 4 | 6 |  | 12 |  | 22 |
| 0 | 3 | 6 | 9 |  | 18 |  | 33 |
| 0 | 4 | 8 | 12 |  | 28 |  | 48 |
| 0 | 5 | 10 |  | 20 | 35 |  | 60 |
| 0 | 6 | 12 |  | 24 | 42 |  | 72 |
| 0 | 7 | 14 |  | 28 |  | 56 | 91 |
| 0 | 8 | 16 |  | 32 |  | 64 | 104 |
| 0 | 9 | 18 |  | 36 |  | 72 | 117 |
| 0 | 10 | 20 |  | 50 |  | 90 | 140 |
| 0 | 11 | 22 |  | 55 |  | 99 | 154 |
| 0 | 12 | 24 |  | 60 |  | 108 | 168 |
| 0 | 13 | 26 |  | 65 |  | 130 |  |
| 0 | 14 | 28 |  | 70 |  | 140 |  |

Example of $H_d$ with irregular distribution of $d_v$ = 15 (p=89)

METHOD FOR ENCODING LOW-DENSITY PARITY CHECK CODE

BACKGROUND OF THE INVENTION

1. Field of the Invention

The present invention relates generally to a method for encoding data, and in particular, to a method for encoding a low-density parity check (LDPC) code.

2. Description of the Related Art

In general, a communication system encodes transmission data before transmission to increase stability of transmission, and prevents excessive retransmissions to increase transmission efficiency. For coding the transmission data, the mobile communication system uses Convolutional Coding, Turbo Coding, and Quasi Complementary Turbo Coding (QCTC). The use of the coding schemes stated above contributes to an increase in stability of data transmission and transmission efficiency.

Recently, wireless communication systems are evolving into advanced wireless communication systems capable of transmitting data at very high speed. The advanced wireless communication system desires to transmit data at higher speed. Accordingly, there is a demand for an advanced coding scheme capable of obtaining higher efficiency than that of the current coding schemes stated above.

Low-density parity check (LDPC) coding is provided as a new coding scheme to meet the demand. A detailed description of the low-density parity check code will now be described herein below. The low-density parity check code was first proposed by Gallager in the early 1960s, and reviewed by MacKay in the late 1990s. The low-density parity check code reviewed by MacKay is based on sum-product algorithm. Since the use of belief propagation decoding, the low-density parity check code has started to attract public attention as a code capable of showing excellent performance approximating the Shannon capacity limit.

Thereafter, Richardson and Chung proposed a density evolution technique for tracing a variation according to iteration in probability distribution of messages generated and updated during decoding on a factor graph constituting a low-density parity check code. For the density evolution technique and infinite iteration on a cycle-free factor graph, Richardson and Chung invented a channel parameter (or threshold) capable of enabling error probability to converge into '0'. That is, Richardson and Chung proposed degree distribution capable of maximizing channel parameters of variable nodes and check nodes on the factor graph. In addition, Richardson and Chung theoretically showed that such a case can be applied even to an LDPC code with a finite length in which there are cycles.

In addition, Richardson and Chung showed that theoretical channel capacity of an irregular LDPC code can approximate the Shannon capacity limit up to only 0.0045 dB using the density evolution technique. In particular, Flarion Co., leading realization of design and hardware (H/W) of the LDPC code, has proposed a multi-edge type vector LDPC code capable of realizing a parallel decoder having a frame error rate lower than that of a turbo code even for an LDPC code with a short length.

The LDPC code is treated as a powerful alternative to the turbo code in the next generation mobile communication system. This is because of parallel structure and low complexity of the LDPC code for decoder realization, and low error floor and good frame error rate in terms of performance. Therefore, it is expected that the future researches will provide LDPC codes having better characteristics.

However, in realization, the current LDPC code is more complex than the turbo code in encoding process, and requires a structure of an optimized code capable of providing better performance than the turbo code at a short frame size. Although active researches have been made to solve this problem, there has been proposed no scheme capable of encoding an optimized LDPC code.

SUMMARY OF THE INVENTION

It is, therefore, an object of the present invention to provide an LDPC coding method with a simple encoding process.

It is another object of the present invention to provide an LDPC coding method having improved performance at a short frame size.

To achieve the above and other objects, there is provided a method for generating a low-density parity check code consisting of an information-part matrix and a parity-part matrix. The method comprises the steps of changing the information-part matrix to an array code structure, and allocating a degree sequence to each of submatrix columns; extending the parity-part matrix such that an offset value between diagonal lines has a predetermined value in a generalized dual-diagonal matrix which is the parity-part matrix; lifting the generalized dual-diagonal matrix; determining an offset value for cyclic column shift for each submatrix of the lifted generalized dual-diagonal matrix; and performing an encoding process for determining a parity symbol corresponding to a column of the parity-part matrix.

Preferably, the degree sequence consists of D={15,15,15, 5,5,5,4,3,3,3,3,3,3,3,3}, and the offset value between diagonal lines is relatively prime to the number of columns in the generalized dual-diagonal matrix.

Preferably, a difference between a sum of offset values for cyclic row shift of a submatrix on a diagonal line in a generalized dual-diagonal matrix which is the parity-part matrix and a sum of offset values for cyclic row shift of a submatrix on an offset diagonal line is not 0.

Preferably, the encoding process comprises the process of (a) determining a parity symbol of a first row in a submatrix with a submatrix column index 0 on a diagonal line of the parity-part matrix; (b) setting a row index in a submatrix of a parity symbol being identical to the determined parity symbol in column index in a submatrix in a submatrix on an offset diagonal line having the same submatrix column index as the submatrix column index of the set parity symbol; (c) determining a parity symbol having the same row index in the set submatrix in a submatrix on a diagonal line having the same submatrix row index as the submatrix row index of the submatrix on the offset diagonal line; and (d) repeatedly performing the steps (b) and (c) until generation of the parity matrix is completed.

Preferably, in step (a), the parity symbol is determined by a sum of information symbols of the information-part matrix existing in the same row as a row index in the submatrix whose parity symbols are determined.

BRIEF DESCRIPTION OF THE DRAWINGS

The above and other objects, features and advantages of the present invention will become more apparent from the following detailed description when taken in conjunction with the accompanying drawings in which:

FIG. 1 is a diagram illustrating a parity check matrix for a general (p,r) array code;

FIG. 2 is a diagram illustrating an example of a matrix $H_d$ in the case where the maximum number of 1s existing in a particular column is defined as $d_v$, the number of such submatrix columns is defined as $n_v$, and the number of 1s existing in the remaining submatrix columns is always 3;

FIG. 7 is a diagram illustrating an example of an information part $H_d$ of a parity check matrix generated in a method described in section A, wherein a maximum variable node degree is 15;

FIG. 9 is a diagram illustrating a parity matrix $H_p$ constructed through matrix lifting by a p×p cyclic permutation submatrix;

FIG. 13A is a diagram illustrating an example of a matrix of an information part $H_d$ for n=870 and p=29;

FIG. 14A is a diagram illustrating an example of a matrix of an information part $H_d$ for n=1590 and p=53;

FIG. 15A is a diagram illustrating an example of a matrix of an information part $H_d$ for n=3090 and p=103;

FIG. 16A is a diagram illustrating an example of a matrix of an information part $H_d$ for n=7710 and p=257;

FIG. 16B is a diagram illustrating an example of a matrix of a parity part $H_p$ for n=7710 and p=257;

DETAILED DESCRIPTION OF THE PREFERRED EMBODIMENT

Figure 3:
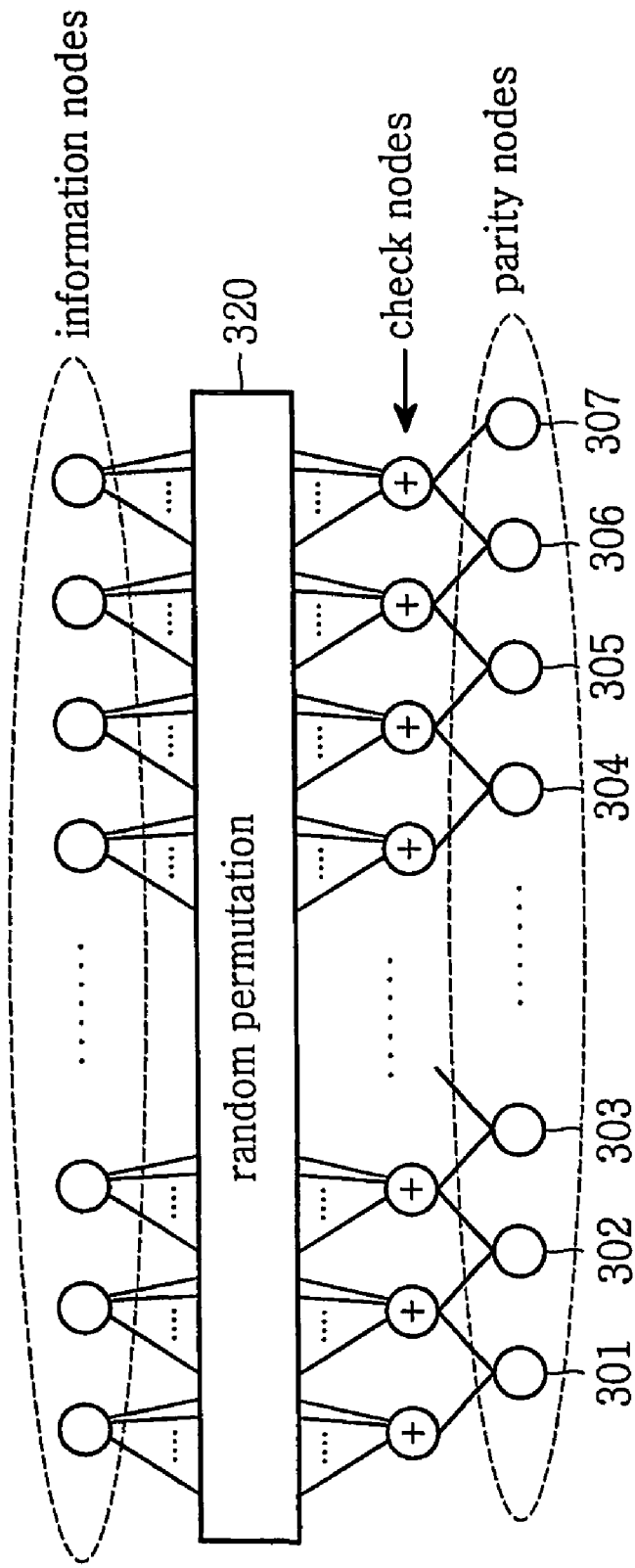
FIG. 3 is a diagram illustrating a factor graph structure of an irregular repeat accumulate code.

A preferred embodiment of the present invention will now be described in detail with reference to the annexed drawings. In the drawings, the same or similar elements are denoted by the same reference numerals even though they are depicted in different drawings. In the following description, a detailed description of known functions and configurations incorporated herein has been omitted for conciseness.

In the following description, the present invention proposes a new LDPC code capable of showing simple coding and good performance. To this end, the present invention defines a new parity check matrix. That is, the present invention proposes a new LDPC code that uses a new parity check matrix. In addition, the present invention shows that the new LDPC code can be simply encoded by linear calculation, and proposes a coding method for the same. Finally, the present invention shows that due to belief propagation decoding, the new LDPC code has better decoding performance than that of the turbo code used in the CDMA2000 1×EV-DV standard.

For convenience, a description the present invention will be made as to performance and realization of an LDPC code with a code rate of ½. However, the code rate can be lifted within the scope of the present invention.

1. Parity Check Matrix Design

In this section, the present invention defines a new parity check matrix generated by grafting and applying parity check matrix structures that define an array code and an irregular repeat accumulate (IRA) code. Also, a description will be made of a method for generating a matrix having a larger size while maintaining a characteristic of a basic matrix generated in this manner.

A. Array Code Structure

Generally, a parity check matrix for a (p,r) array code is defined as FIG. 1. FIG. 1 is a diagram illustrating a parity check matrix for a general (p,r) array code. With reference FIG. 1, a description will now be made of a parity check matrix for a general (p,r) array code.

In FIG. 1, p denotes a prime number, and $\sigma^j$ denotes a p×p cyclic permutation matrix obtained by cyclic-shifting respective rows of a p×p identity matrix I which is a square matrix having a size of p, by j. A row and a column each composed of a set of the $\sigma^j$ are called a submatrix row and a submatrix column, respectively. A column and a row of a parity check matrix defining an array code uniformly have p 1s and r 1s, respectively. When the p is reasonably large, a ratio of 1s in the matrix is reduced, making a structure of a low-density parity check code. Such an array code does not have a cycle structure with a length of 4. That is, if elements belonging to 4 partial matrixes $\sigma^{ja}$, $\sigma^{ib}$, $\sigma^{ja}$ and $\sigma^{jb}$ (i≠j) forming a square, or cycle 4, in a parity check matrix have a cycle-4 structure, the following relation should be satisfied.

$$ia-ib=ja-jb \Box (i-j)=(a-b)(\bmod p) \quad (1)$$

In Equation (1), it should be satisfied that a=b. However, because 'a' and 'b' exiting in different rows always have different values, Equation (1) cannot be satisfied. Therefore, an array code having the parity check matrix described above has not a cycle-4 structure.

The present invention generates a new matrix structure by modifying the parity check matrix structure of the array code described above. A description will now be made of a process of generating a new matrix structure to be used in the present invention. The object of the modification is to obtain an irregular structure in which distribution of 1 existing in each column of a matrix to be generated is irregular, based on an array code structure not having a cycle-4 structure. This process should be performed such that distribution of 1 existing in each row is relatively uniform, i.e., only a total of 2 types exist. A description will now be made of a method for generating a new matrix structure used in the present invention.

(1) A $j^{th}$ submatrix column of a parity check matrix forming an array code is composed of submatrixes represented by $$H_j = [I \; \sigma^j \; \sigma^{2j} \; \ldots \; \sigma^{(r-1)j}]^T \qquad (2)$$

(2) Depending on a predetermined degree distribution, a degree sequence of each submatrix column is defined as $$D = [d_0 \; d_1 \; \ldots \; d_{s-1}] \qquad (3)$$

In Equation (3), $d_j$ denotes a column degree corresponding to a $j^{th}$ submatrix column, and 's' denotes the total number of submatrix columns. In addition, the 's' is set such that it is identical to the total number, $d_v$, of 1s existing in a particular column.

(3) Depending on the degree sequence D defined in (2), a $j^{th}$ submatrix column is modified as $$H'_j = [0 \; 0 \; \ldots \; \sigma^{jxtj} \; \sigma^{jx(tj+1)} \; \ldots \; \sigma^{jx(tj+dj-1)} \; 0 \; \ldots \; 0]^T, \; t_j = t_{j-1} + d_{j-1} (\bmod s) \qquad (4)$$

In Equation (4), $t_j$ denotes a submatrix row number from which a non-0 submatrix starts in a $j^{th}$ submatrix column $H'_j$.

(4) A matrix $H_d$ to be generated is defined by Equation (5) in which submatlix columns are replaced with column vectors.

$$H_d = [H_0 \; H_1 \; \ldots \; H_j \; \ldots \; H_{s-1}] \qquad (5)$$

When a particular submatrix column of a matrix is defined according to the process described above, a particular column existing in each submatrix column always has as many 1s as only a degree allocated to the corresponding submatrix column. A matrix composed of the submatrix columns will minimize submatrix overlap between matrixes. Therefore, the number of 1s existing in a particular row of the entire matrix will also be minimized. That is, it can be easily understood that the number of 1s in one row in the entire matrix will always be 2 or 1. Because the generated matrix $H_d$ has a structure obtained by removing some submatrixes from the array code structure, it always does not have a cycle-4 structure like the array code.

FIG. 2 is a diagram illustrating an example of a matrix $H_d$ in the case where the maximum number of is existing in a particular column is defined as $d_v$, the number of such submatrix columns is defined as $n_v$, and the number of 1s existing in the remaining submatrix columns is always 3.

In the present invention, an information-part matrix $H_d$ 220 of a parity check matrix H defined based on the array code structure described in connection with FIG. 2 will be used as a submatrix of a parity check matrix H of a low-density parity check code to be defined in the present invention. A description will now be made of an irregular repeat accumulate (IRA) code for generation of a submatrix forming a parity part of the parity check matrix H.

B. Generalized Dual-Diagonal Matrix

It is known that an irregular repeat accumulate (IRA) code has a simple encoder structure and has relatively high performance by a message passing decoder. Such an irregular repeat accumulate code can be regarded as one type of the low-density parity check mode.

FIG. 3 is a diagram illustrating a factor graph structure of an irregular repeat accumulate code. With reference to FIG. 3, a description will be made of a factor graph structure of an irregular repeat accumulate code. The factor graph of the irregular repeat accumulate code of FIG. 3 is a systematic version, in which all parity nodes corresponding to parity symbols of a codeword except only one parity node have a degree of 2. That is, each of parity nodes 301, 302, 303, ..., 304, 305, 306 and 307 has 2 edges connected thereto. Such a parity node structure is advantageous in that generation of parity symbols based on given information symbols is simply achieved by linear calculation. In addition, as can be understood from FIG. 3, information nodes of the irregular repeat accumulate code can have various degree distributions. Values of the information nodes are connected to check nodes through a random permutation 320.

Figure 4:
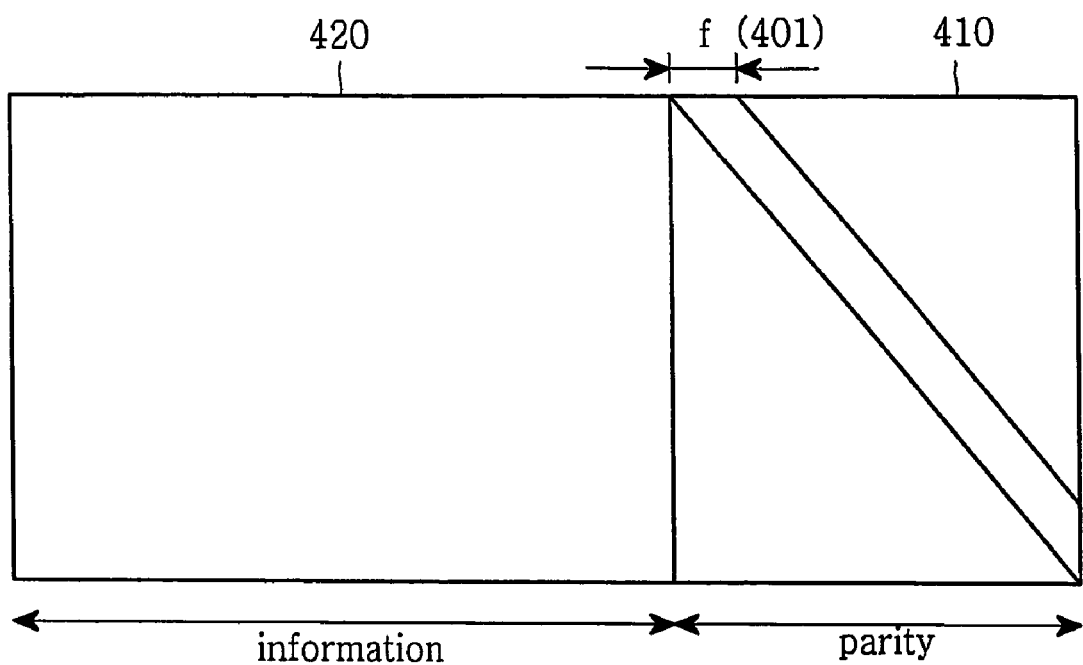
FIG. 4 is a diagram illustrating a matrix of a low-density parity check code having an irregular repeat accumulate code.

A matrix construction of the irregular repeat accumulate code having the factor graph of FIG. 3 can be illustrated in FIG. 4. FIG. 4 is a diagram illustrating a matrix of a low-density parity check code having an irregular repeat accumulate code.

In the matrix of a low-density parity check code illustrated in FIG. 4, diagonal lines in a parity part represent '1', and an offset 'f' (401) between the diagonal lines have a value of 1 in a general irregular repeat accumulate code. Therefore, a submatrix corresponding to the parity part of a parity check matrix defining an irregular repeat accumulate code has a construction of a dual-diagonal matrix. The number of 1s existing in each column of an information part in the parity check matrix has irregular distribution. The distribution is defined by a random permutation unit of FIG. 4.

The present invention considers only the parity part of the irregular repeat accumulate code. Therefore, the present invention generalizes only the parity part and proposes a new type of matrix.

Figure 5:
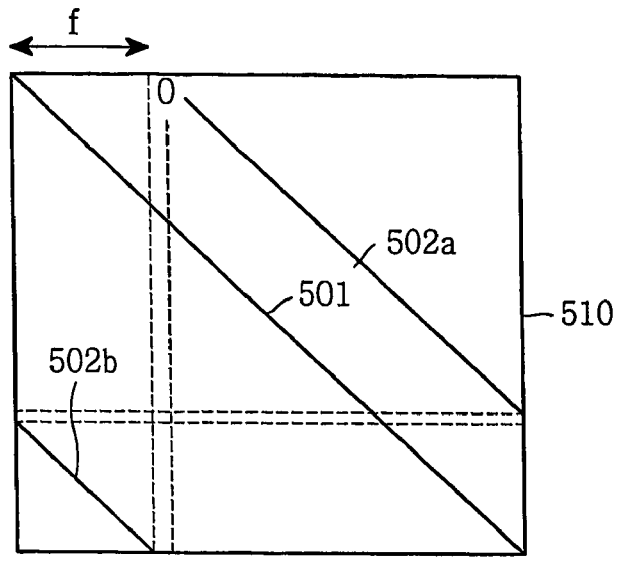
FIG. 5 is a diagram illustrating a parity matrix in which an offset value 'f' of a dual-diagonal matrix is lifted to a particular value.

In the case of the general irregular repeat accumulate code of FIG. 4, an offset 'f' between diagonal lines has a value of 1 (f=1). In the present invention, if the offset value 'f' is lifted so that it has a particular value, a dual-diagonal matrix of the parity part can be generalized as illustrated in FIG. 5. In FIG. 5, a first diagonal line 501 forms a diagonal line from a position in the first column and first row to a position in the last column and last row in the matrix. A first partial diagonal line 502a of a second diagonal line has a value of '0' in a first position column-shifted by the offset value, and has a value of '1' in the remaining positions up to the last point thereof. A second partial diagonal line 502b of the second diagonal line forms a diagonal line with a value of '1' from a first column in the next row.

Herein, FIG. 5 is a diagram illustrating a parity matrix in which an offset value of a dual-diagonal matrix is lifted to a particular value. Although the offset value is changed as illustrated in FIG. 5, there always exists a column having only one '1'. It should be noted that if the number of is existing in all columns is 2, a rank of the dual-diagonal matrix becomes smaller than the number of rows in the matrix. Therefore, the first row of the second diagonal line should have '0' rather than '1' as illustrated in FIG. 5. In a case of an r×r matrix, i.e., a square matrix with a matrix size 'r' illustrated in FIG. 5, if an offset value 'f' of a dual-diagonal matrix and a size 'r' of the matrix have no common factor, it is possible to generate all of r parity symbols by simply performing addition calculation on a set of given information symbols r times. In order to prove this, consideration will be taken into the following theorems.

Theorem 1: In an Abelian group $AG_r = \{0,1,2,\ldots,r-1\}$, all elements are generated by performing addition on a particular element 'f' which is relatively prime to 'r' and is not '0', less than 'r' times. In order to prove this, if all elements in the $AG_r$ cannot be generated by performing addition on the particular element 'f' which is relatively prime to 'r' and is not '0', less than 'r' times, there is 'k' less than 'r', which satisfies a condition of Equation (6).

$$kf \equiv 0 \pmod{r} \tag{6}$$

However, Equation (6) is against the assumption that 'f' is relatively prime to 'r'. That is, a minimum value of the 'k' satisfying Equation (6) should always be 'r'. Therefore, all elements in the $AG_r$ can be generated by performing addition calculation on the element 'f' r times.

The dual-diagonal matrix illustrated in FIG. 5 is a matrix corresponding to a parity part of a parity check matrix. Therefore, as to an $i^{th}$ column in the matrix of FIG. 5, it is possible to always obtain information shown in Equation (7) from the $i^{th}$ column in a matrix corresponding to the remaining information part of the parity check matrix.

$$v_i = \sum_{i=1}^{a_i} d_i \tag{7}$$

In Equation (7), $d_i$ denotes an $i^{th}$ information symbol, and $a_i$ denotes the number of 1s existing in an $i^{th}$ column of a matrix corresponding to an information part of a parity check matrix. In addition, $\Sigma$ denotes addition calculation in GF(2). The GF(2) refers to Galois Field over 2, and means a finite field defined in modulo 2. The term "finite field" refers to a set, in which the number of elements is finite and the elements are closed for addition and multiplication over modulo 2, there are an identity element and an inverse element for addition, there are an identity element for multiplication and an inverse element for a non-0 element, and commutative low, associative law and distributive law are satisfied for the addition and multiplication. Therefore, the GF(2) means a set of $\{0,1\}$ satisfying such a property. As a result, a first parity symbol that can be obtained by a parity check equation corresponding to a first column in the matrix of FIG. 5 is defined as $$P_0 = v_0 \tag{8}$$

In the matrix construction of FIG. 5, a relation between a column index and a row index for particular 1s existing in a diagonal line and an offset diagonal line is defined as $$y_1 = x_1, y_2 = x_2 - f \tag{9}$$

If two formulas shown in Equation (9) are used, $P_{r-f}$ can be calculated using $P_0$ in accordance with Equation (10).

$$P_{r-f} = P_0 + V_{r-f} \tag{10}$$

In addition, because a parity check matrix has a construction of a dual-diagonal matrix as illustrated in FIG. 5, Equation (10) can be modified into $$P_{r-if} = P_{r-(i-1)f} + V_{r-if}, i=1, \ldots, r-1 \tag{11}$$

Figure 6:
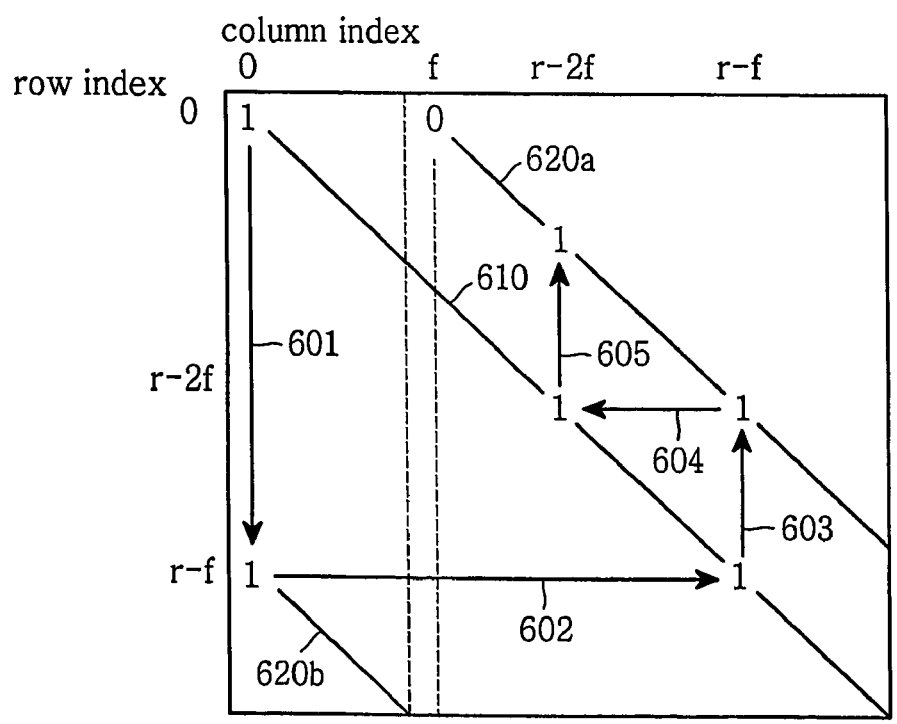
FIG. 6 is a diagram illustrating a process of sequentially calculating values of $P_0$, $P_{r-f}$, $P_{r-2f}$, . . . in the encoding process of FIG. 5.

In this way, a particular parity symbol $P_{r-if}$ can be obtained by Equation (11), and based on Theorem 1, if 'r' is relatively prime to 'f', as 'i' increases, a value of (r−if) (mod r) has all value of 1 to r−1 only once. Accordingly, if 'r' is relatively prime to 'f', values of all parity symbols can be calculated through the foregoing process. Therefore, in the foregoing method, the parity check matrix having the parity part illustrated in FIG. 5 can always undergo simple encoding by linear calculation. FIG. 6 is a diagram illustrating a process of sequentially calculating values of $P_0, P_{r-f}, P_{r-2f}, \ldots$ in an encoding process.

Referring to FIG. 6, a connection is made from a position value of a $0^{th}$ column and a $0^{th}$ row to a position value of the $0^{th}$ column and an $(r-f)^{th}$ row as represented by reference numeral 601. It can be noted that the position value of the $0^{th}$ column and the $(r-f)^{th}$ row is connected to a position value of an $(r-f)^{th}$ column and the $(r-f)^{th}$ row as represented by reference numeral 602. In this way, 1s are located only in a first diagonal line 610, a first partial diagonal line 620a of a second diagonal line, and a second partial diagonal line 620b of the second diagonal line. Because only one value of 1 exists in a first column of the diagonal lines, a second-order function is calculated by continuously finding a value of 1 in the forgoing manner. As a result, all values can be found.

The generalized dual-diagonal matrix construction described above will be used as a submatrix $H_p$ of a parity part in a parity check matrix H of a low-density parity check code to be defined in the present invention. A description will now be made of a method for generating a parity check matrix of a low-density parity check code to be defined in the present invention.

C. Parity Check Matrix Construction

In this section, a description will be made of a method for generating a new parity check matrix H according to the present invention using a generalized dual-diagonal matrix construction described in section B, and also made of a construction thereof. A parity check matrix described below defines a matrix $H_d$ defined based on the array code structure described in section A, as an information part of a parity check matrix H. Further, the parity check matrix described below defines the normalized dual-diagonal matrix $H_p$ described in section B as a parity part of the information-part matrix H. Therefore, a parity check matrix H defining a low-density parity check code to be designed in the present invention has a construction represented by $$H=[H_d|H_p] \text{ where } H_d\text{: parity check sub-matix for information part } H_p\text{: parity check sub-matrix for parity part} \tag{12}$$

In Equation (12), respective submatrix columns in an information-part matrix $H_d$ of the parity check matrix are defined by a degree sequence D based on a predefined degree distribution, and a unit submatrix $\sigma^{ij}$ constituting each submatrix column is a cyclic permutation matrix obtained by column-shifting a p×p identity matrix with a size of 'p' by ij which is a product of a submatrix column index 'i' and a submatrix row index 'j'. Here, 'p' is always a prime number. In addition, $H_p$ lifts 1s and 0s existing in a matrix to a p×p matrix and a 0 matrix, respectively, in order to match its construction to a construction of $H_d$.

A description will now be made of processes of generating a low-density parity check code according to an embodiment of the present invention.

(I) Degree Distribution and $H_d$ Construction

Richardson et al. showed that when message passing decoding is achieved in a factor graph defining a low-density parity check code, it is possible to trace a variation in messages by a variable & check node message update process and an iterative processing process by a sum-product algorithm through a variation in probabilistic distribution. Further, Richardson et al. showed that there is a channel parameter threshold capable of determining whether an average error probability of a low-density parity check code defmed with a factor graph having a degree distribution through such a density evolution technique converges into '0'. In addition, Richardson et al. showed that for a channel parameter lower than the channel parameter threshold, when infinite iteration is assumed in a decoding process, probability of bit error always can converge into '0'. Therefore, such a density evolution technique can be used as a design tool capable of optimizing degree distribution of a low-density parity check code capable of improving a threshold for a particular channel environment. Thus, many researches have been made to calculate a degree distribution optimized for a low-density parity check code and a threshold at that time.

The present invention approximates a predefined optimized variable node degree distribution to a variable node degree distribution of a parity check matrix H to be defined in the present invention. In this case, variable nodes with a degree of 2 are all allocated to respective columns in a parity part $H_p$ of the H, and variable nodes with a degree higher than 2 are allocated to respective columns in an information part $H_d$ of the H. In addition, from the array code structure described in section A and the submatrix construction of the generalized dual-diagonal matrix described in section B, a check node degree of the parity check matrix H always has only one or two minimized types in terms of the number of all given 1s.

Now, a degree sequence for defining an information part $H_d$ of a parity check matrix to be defined in the present invention will be determined. If a maximum variable node degree in a factor graph defining a low-density parity check code is defined as $d_v$, distribution of respective edges existing in a variable node can be expressed with a polynomial represented by $$\lambda(x) = \sum_{i=2}^{d_v} \lambda_i x^{i-1} \qquad (13)$$

In Equation (13), $\lambda_i$ denotes a ratio of edges existing in a variable node with a degree of 'i'. A ratio $c_j$ of edges existing in a variable node with a degree of 'j' in a factor graph for a given $\lambda(x)$ can be expressed as $$c_j = \frac{\lambda_j / j}{\sum_{i \geq 2} \lambda_i / i} \qquad (14)$$

Considering implementation in Equation (14), a construction of a parity check matrix will be described for a maximum variable node degree=15. It is known that when a value of a maximum variable node degree in a factor graph defining a low-density parity check code is 15, an optimal degree distribution for a code rate of ½ in a binary input additive white Gaussian noise (Bi-AWGN) channel environment is given as shown in Equation (15) by the density evolution technique.

$$\lambda_2=0.23802, \lambda_3=0.20997, \lambda_4=0.03492, \lambda_5=0.12015,$$
$$\lambda_7=0.01587, \lambda_{14}=0.00480, \lambda_{15}=0.37627 \qquad (15)$$

In an additive white Gaussian noise (AWGN) channel for allowing error probability of variable nodes to converge into '0', a maximum channel parameter noise variance $\sigma^*$ is 0.9622, and this becomes 0.3348 dB in terms of Eb/No. That is, a low-density parity check code defined by a factor graph having the foregoing degree distribution shows performance approximating the Shannon capacity limit by 0.3348 dB by belief propagation decoding for which infinite block size and infinite iteration are assumed. In a factor graph having the foregoing degree distribution, ratios of variable nodes having respective degrees are given as $$c_2=0.47709, c_3=0.28058, c_4=0.034997, c_5=0.096332$$
$$c_7=0.0090386, c_{14}=0.001374, c_{15}=0.100560 \qquad (16)$$

In the parity check matrix to be defined in the present invention, variable nodes with a degree of 2 should always be allocated to a parity part $H_p$, and only other variable nodes except the variable nodes with a degree of 2 should always be allocated to an information part $H_d$. In addition, all columns in each submatrix column of the information part $H_d$ have the same column weight. Therefore, ratios of variable nodes having respective degrees in a factor graph of the parity check matrix H are approximated as shown by Equation (17).

$$c_2=1/2=0.5, c_3=8/30=0.26667, c_4=1/30=0.03333,$$
$$c_5=3/30=0.1, c_1=c_{14}=0, c_{15}=3/30=0.1 \qquad (17)$$

With use of the variable node ratios shown in Equation (17), a degree distribution polynomial $\lambda(x)$ is calculated gain, and a threshold $\sigma^*$ in AWGN of a low-density parity check code defined by the corresponding degree distribution is calculated in accordance with Equation (18).

$$\sigma^*=0.9352(Eb/No)^*=0.5819 \text{ dB} \qquad (18)$$

A value determined by Equation (18) is a value corresponding to a low-density parity check code with a code rate of ½. This value was derived using the density evolution technique based on a Gaussian approximation value as an analysis technique, and if estimated probability of bit error is less than $10^{-6}$, the corresponding value is calculated considering that there is no error. A degree sequence allocated to each submatrix column of the information part $H_d$ using the calculated value can be defined as $$D=\{15,15,15,5,5,5,4,3,3,3,3,3,3,3\} \qquad (19)$$

In the present invention, the information part $H_d$ of the parity check matrix H described in section A where the array code structure is described can be defined based on the array code structure according to the degree sequence defined by Equation (18).

FIG. 7 is a diagram illustrating an example of an information part $H_d$ of a parity check matrix generated in the method described in section A, wherein a maximum variable node degree is 15. In the matrix construction illustrated in FIG. 7, columns and rows represent submatrix columns and submatrix rows, respectively. Numerals indicting the columns and rows represent cyclic shift of the submatrix columns and submatrix rows. Each of the numerals is comprised of a p×p submatrix in which p=89. Therefore, a matrix of the information part $H_d$ generated in the forgoing method becomes a $(d_v \cdot p) \times (d_v \cdot p)$ matrix.

(II) Lifting and Hp Construction

Figure 8:
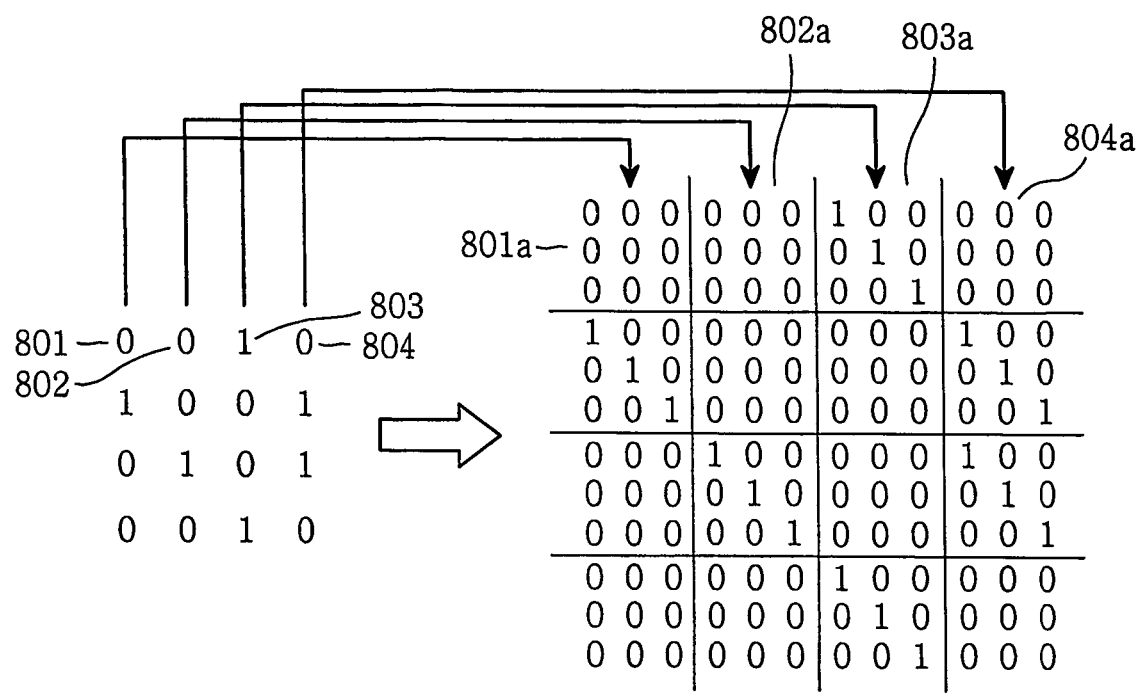
FIG. 8 is a diagram illustrating a 12×12 matrix obtained by matrix-lifting a basic 4×4 matrix in a method of replacing each element in a 4×4 matrix with a 3×3 identity matrix or a 3×3 0 matrix.

Generally, lifting of a matrix refers to a method of lifting a size of a basic matrix by submatrix replacement for a matrix having 0 and 1 in a particular position. This will be described with reference to FIG. 8. FIG. 8 is a diagram illustrating a 12×12 matrix obtained by matrix-lifting a basic 4×4 matrix in a method of replacing each element in a 4×4 matrix with a 3×3 identity matrix or a 3×3 0 matrix.

As illustrated in FIG. 8, matrix lifting forms a square matrix having as many elements of 0 as a multiple of a target lifting size, for the elements of 0. Only a first row will be described. Elements of respective columns located in the first row becomes {0,0,1,0}, and reference numerals 801, 802, 803 and 804 are allocated thereto, respectively. Of all the elements, 3 elements 801, 802 and 804 having a value of 0 are lifted to 3×3 matrixes 801a, 802a and 804a, respectively. The element 803 having a value of 1 in the first row is lifted to a 3×3 identity matrix 803a. The same matrix lifting is also applied to elements in other rows.

As described above, matrix lifting generally refers to a method of extending a size of a matrix by inserting a k×k submatrix into a position of each element of a basic matrix composed of 0 and 1. Generally, a cyclic permutation matrix obtained by cyclic-shifting each column of an identity matrix is used as the inserted k×k matrix.

A parity part $H_p$ of the parity check matrix H to be defined in the present invention is a generalized dual-diagonal matrix described in section B. In addition, considering that $H_d$ generated in the method described in (I) of section C is comprised of p×p submatrixes, the $H_p$ is also constructed by lifting an r×r generalized dual-diagonal matrix using a p×p submatrix.

FIG. 9 is a diagram illustrating a parity matrix $H_p$ constructed through matrix lifting by a p×p cyclic permutation submatrix. With reference to FIG. 9, a description will now be made of parity matrix lifting. A matrix lifted by the cyclic permutation submatrix removes 1 existing in a first row of $\sigma^{j_i}$ for linear time encoding of a low-density parity check code and linear independency between respective rows. The parity part $H_p$ constructed in the manner of FIG. 9 becomes an (rp)×(rp) matrix, and in each submatrix $\sigma^{j_i}$, $j_i$ denotes an offset value for cyclic column shift allocated to each submatrix. A description will now be made of a method for enabling encoding by linear calculation.

It can be noted that when the description made in section B (Generalized Dual-Diagonal Matrix) is applied to the parity part $H_p$ lifted in the method of FIG. 9, each submatrix column of the parity part $H_p$ is selected only once by r calculations when 'r' is relatively prime to 'f'. In this one selection process, it is possible to perform an operation of calculating a parity symbol corresponding to a particular column in a submatrix column. Therefore, in order to calculate parity symbols corresponding to all columns in a particular p×p submatrix $\sigma^{j_i}$, calculation for parity symbols corresponding to p columns should be performed only once during rp calculations. A description will now be made of a condition for an offset value of a submatrix for satisfying the foregoing condition.

In the matrix construction of the parity part $H_p$ illustrated in FIG. 9, a relation between a row index $y^{(1)}_i$ and a column index $x^{(1)}_i$ in a submatrix with a submatrix row index=i in a diagonal line is defined as $$y_i^{(1)} = x_i^{(1)} - j_{2i} \pmod{p} \quad (20)$$

A relation between a row index $y^{(2)}_i$ and a column index $x^{(2)}_i$ in a submatrix with a submatrix row index=i in an offset diagonal line is defined as $$y_i^{(2)} = x_i^{(2)} - j_{2i+1} \pmod{p} \quad (21)$$

Based on Equation (20) and Equation (21), a value of a parity symbol $P_{j_0}$ can be obtained from a first row in submatrixes $\sigma^{j_0}$ and $\sigma^{j_1}$ with a submatrix row index 0 in accordance with Equation (22).

$$P_{j_0} = v_0 \quad (22)$$

In Equation (22), $v_0$ denotes a partial check-sum value obtained from a first row of the information part $H_d$ in a parity check matrix. For a column index $=j_0$, a row index in a submatrix of an offset diagonal line sharing the same column can be expressed as $$y_{(r-f)}^{(2)} = x_0^{(1)} - j_{2(r-f)+1} = j_0 - j_{2(r-f)+1} \quad (23)$$

A column index in a submatrix of a diagonal line sharing the same row index can be expressed as $$x_{(r-f)}^{(1)} = y_{(r-f)}^{(2)} + j_{2(r-f)} = j_0 - j_{2(r-f)+1} + j_{2(r-f)} \quad (24)$$

If 'r' and 'f' of Equation (23) and Equation (24) are relatively prime to each other, all submatrixes in the parity part $H_p$ can be selected only once while such a process is repeated r times. Therefore, a row index in the submatrix obtained again by repeating the foregoing process r times can be expressed as $$x_{(0)}^{(1)} + \sum_{i=0}^{2r-1} (-1)^i j_i \quad (25)$$

$$\pmod{p}$$

In Equation (25), if lifting is made with all other column indexes of the submatrix, a variation x in column indexes updated for a submatrix $\sigma^{j_i}$ existing in a diagonal line through r calculations is determined by $$x = \sum_{i=0}^{2r-1} (-1)^i j_i \quad (26)$$

Theorem 2: All non-0 elements in a finite field $F_p=\{0,1,2,\ldots,p-1\}$ defined by a particular prime number p can always be generated only once by performing less than 'p' additions thereon. If there is 'k' less than 'p' satisfying Equation (27) for a particular non-0 element 'a' in the finite field $F_p$ in order to prove this, the assumption that 'p' is a prime number is disobeyed. Therefore, a minimum value of k satisfying Equation (27) is always 'p'.

$$ka = \frac{(a + a + \ldots a)}{k} = 0 \quad (27)$$

$$\pmod{p}$$

Therefore, all non-0 element 'a' in the finite field $F_p$ can be generated by performing addition thereon less then 'p' times. From Theorem 2, if a column index variation of a particular submatrix $\sigma_{j_i}$ updated by r linear calculations is not 0, when the j linear calculations are repeated 'p' times altogether, parity symbols for p column indexes can be generated. In this manner, all of rp parity symbols can be generated. That is, a condition of Equation (28) is satisfied.

$$x = \sum_{i=0}^{2r-1} (-1)^i j_i \neq 0 \quad (28)$$

It is possible to general parity symbols corresponding to all columns in the submatrix by repeating r calculations of Equation (28) p times. In addition, a parity symbol corresponding to a particular column in each of (r−1) submatrixes existing on a diagonal line can be generated one by one during the r calculations. Therefore, it can be noted that parity symbols having rp different column indexes can be generated only once by rp linear calculations.

Figure 10:
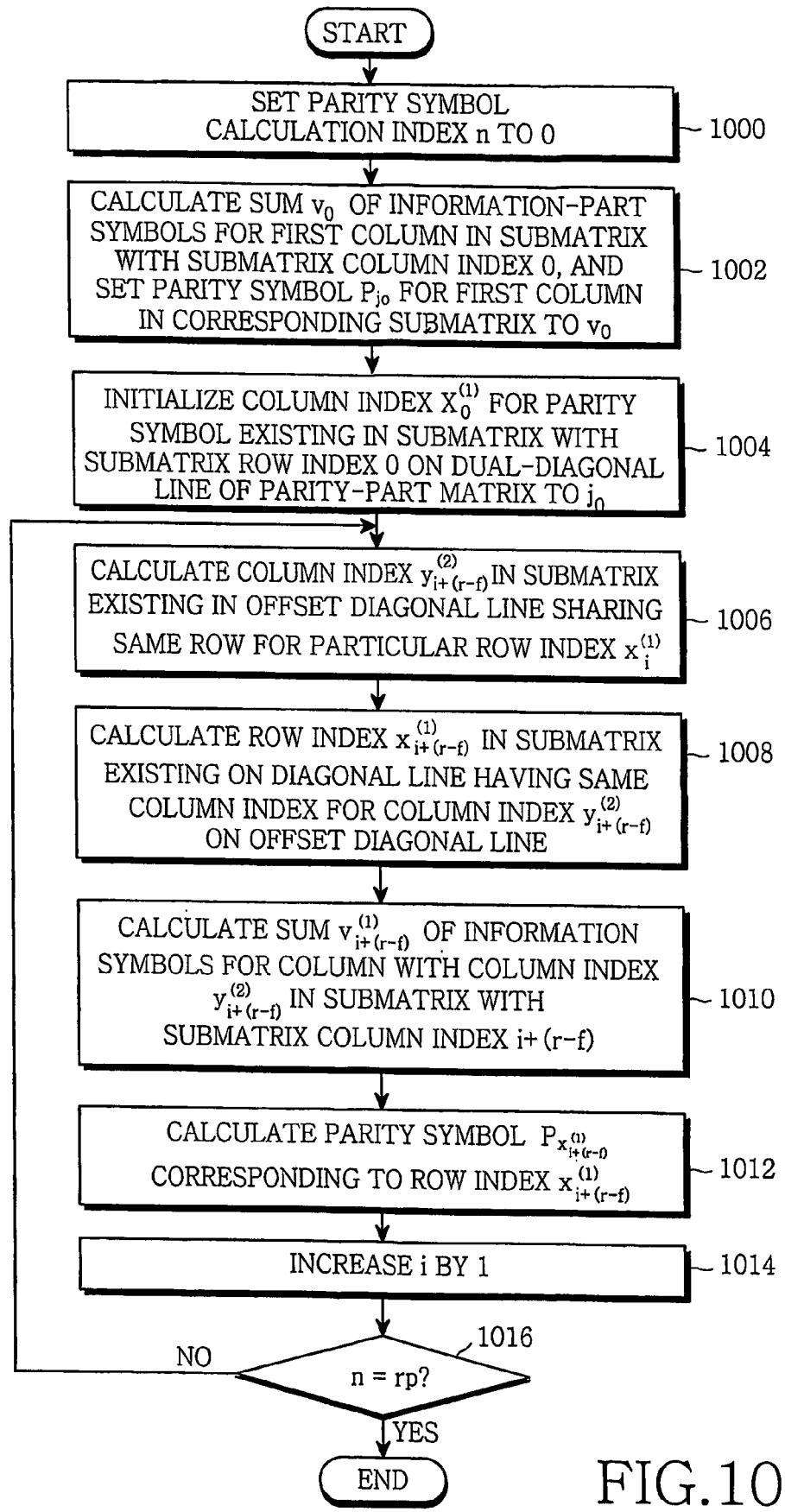
FIG. 10 is a flowchart illustrating a method for generating a matrix of a parity part according to a preferred embodiment of the present invention.

A process of generating a matrix of a parity part $H_p$ in the method described above will be described with reference to FIG. 10. FIG. 10 is a flowchart illustrating a method for generating a matrix of a parity part according to a preferred embodiment of the present invention.

In step 1000, a parity symbol calculation index n is set to 0 in order to generate a matrix of a parity part. Thereafter, in step 1002, an information symbol sum $v_0$ is calculated according to a matrix construction of an information part $H_d$ for a first column in a submatrix with a submatrix column index=0, and a parity symbol $P_{i_0}$ for a first row in the corresponding submatrix is set to $v_0$. In step 1004, a column index $x^{(1)}_0$ for a parity symbol existing in a submatrix with a submatrix column index=0 in a diagonal line of a parity part $H_p$ is initialized to $j_0$.

After determining the parity symbol $P_{i_0}$ for a first row by calculating the sum $v_0$ of information symbols according to a matrix construction of the information part $H_d$, and initializing the column index, the routine proceeds to step 1006. In step 1006, for a particular column index $x^{(1)}_i$, a row index $y^{(2)}_{i+(r-f)}$ in a submatrix existing in an offset diagonal line sharing the same column is calculated by $$y_{i+(r-f)}^{(2)} = x_i^{(1)} - j_{2(i+(r-f))+1} \tag{29}$$

Thereafter, in step 1008, a column index $x^{(1)}_{i+(r-f)}$ in a submatrix existing in a diagonal line having the same row index as a row index $y^{(2)}_{i+(r-f)}$ in an offset diagonal line is calculated by $$x_{i+(r-f)}^{(1)} = y_{i+(r-f)}^{(2)} + j_{2(i+(r-f))} \tag{30}$$

In step 1010, a sum $v^{(2)}_{i+(r-f)}$ of information symbols existing in a row with a row index $y^{(2)}_{i+(r-f)}$ in a submatrix with a submatrix row index i+(r-f) is calculated.

Thereafter, in step 1012, a parity symbol $p_{x_{i+(r-f)}^{(1)}}$ corresponding to a row index $x^{(1)}_{i+(r-f)}$ is calculated using Equation (31).

$$P_{x_{i+(r-f)}^{(1)}} = P_{x_i^{(1)}} + v_{y_{i+(r-f)}^{(2)}} \tag{31}$$

Thereafter, in step 1014, the n is increased by 1. In step 1016, a submatrix row index i is updated as shown by $$i = i + (r - 2f) \tag{32}$$

In step 1018, it is determined whether the n is equal to rp. That is, it is determined in step 1018 whether encoding is completed. If it is determined in step 1018 that the n is equal to rp, the routine ends, determining that encoding is completed. However, if it is determined in step 1018 that the n is not equal to rp, the routine returns to step 1006 and repeats its succeeding steps to continuously perform encoding.

Figure 11:
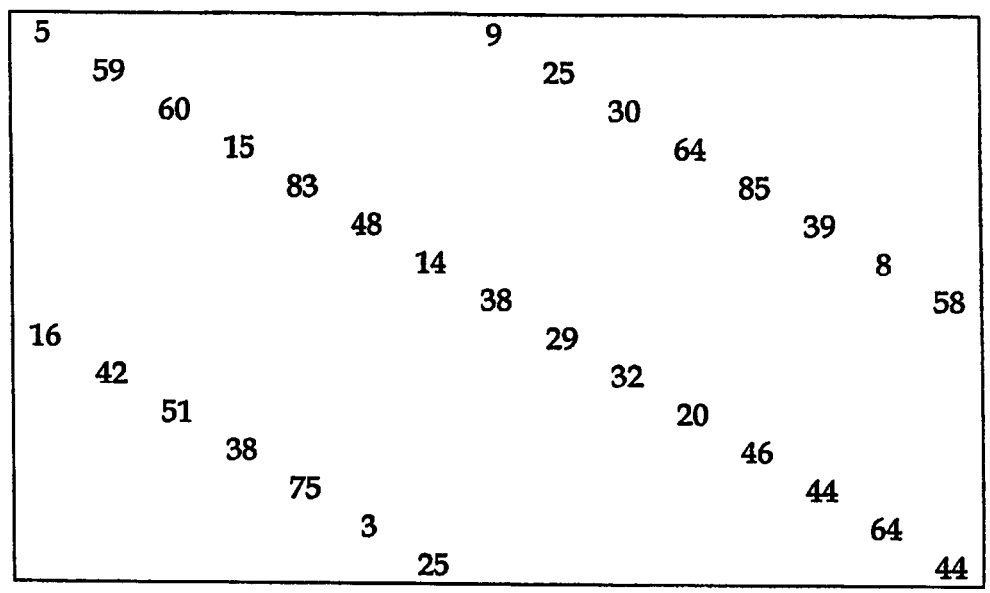
FIG. 11 is a diagram illustrating a parity matrix of a generalized dual-diagonal matrix lifted for r=15, f=7 and p=89.

In the foregoing process, it should be noted that all index calculations—submatrix row index and row index—mean a modulo-p calculation, and calculations on subscripts and superscripts in the index calculation process also mean a modulo-p calculation. Addition in the process of calculating parity symbols or information symbols is a modulo-2 calculation. An example of $H_p$ generated so as to satisfy such a condition is illustrated in FIG. 11. Values of numerals illustrated in FIG. 11 mean offset values of submatrixes.

(III) Overall Construction of H

A parity check matrix H for a low-density parity check code to be defined in the present invention is defined by dividing a matrix into an information part $H_d$ and a parity part $H_p$ and concatenating them, for systematic encoding. Generation of the information part $H_d$ and the parity part $H_p$ is achieved in the method described in section (I) and section (II), and the generated information part $H_d$ and parity part $H_p$ become a $(d_v \cdot p) \times (d_v \cdot p)$ matrix and an $(rp) \times (rp)$ matrix, respectively. Herein, $d_v$ denotes a maximum variable node degree existing in an irregular low-density parity check code, 'p' denotes a dimension of a submatrix, and 'r' denotes a dimension of a basic matrix given before lifting the parity part $H_p$. Therefore, 'r' should be equal to $d_v$ for concatenation.

It can be easily understood that there is no length-4 cycle in the information part $H_d$ and the parity part $H_p$ of the matrix. Also, it can be easily understood that if a diagonal offset 'f' of the parity part $H_p$ is set to a value approximating r/2, there is no length-4 cycle between a submatrix column of an information part $H_d$ where a column weight is less than r/2 and a particular column of a parity part $H_p$. However, in the case of columns having a maximum variable node degree as a weight in the information part $H_d$, there is a possible case where there are columns of the parity part $H_p$ and a length-4 cycle. If a submatrix offset value of the parity part $H_p$ is appropriately selected, it is possible to prevent a length-4 cycle from existing in the overall parity check matrix H by simply removing it.

2. Performance of LDPC Code

Hitherto, a description has been made of a construction of a parity check matrix for defining a rate-½ irregular low-density parity check code that can easily undergo systematic encoding by linear calculation. The parity check matrix defined in chapter 1 is divided into an information part and a parity part in order to generate parity symbols of a codeword according to given information symbols. A matrix of the information part is constructed such that a weight of each column in a matrix construction based on an array code structure has a degree approximating an optimum irregular degree distribution of a variable node, and a matrix of the parity part is constructed by lifting a generalized dual-diagonal matrix construction using a submatrix having a random offset. Herein, a variable node with a degree of 2 is always allocated to columns of the parity part.

A description will now be made of performance of a low-density parity check code constructed by the parity check matrix defined in the foregoing description. For this, a description will first be made of a decoding algorithm and an experimental environment for evaluating performance of a low-density parity check code.

A. Iterative Belief Propagation Decoding

A low-density parity check code defined by an M×N parity check matrix can be expressed by a factor graph comprised of M check nodes and N variable nodes. Summarizing a message update process in a check node with a degree=$d_c$ and a variable node with a degree=$d_v$ in a log domain, message update in the check node can be expressed as Equation (33), message update in the variable node can be expressed as Equation (34), and update of a log likelihood ratio (LLR) can be expressed as Equation (35).

$$r_{mn}^{(j)} = \ln\left(\frac{1 + \prod_{i=1}^{d_c-1} \tanh(q_i^{(j)}/2)}{1 - \prod_{i=1}^{d_c-1} \tanh(q_i^{(j)}/2)}\right) \tag{33}$$

where $r_{mn}^{(j)}$ is a message from a check node $m$ to a variable node $n$ at the $j$th iteration and $q_i^{(j)}$ is a rearranged message incident to a check node $m$ with $q_0^{(j)} = q_{mn}^{(j)}$ at the $j$th iteration.

In Equation (33), $r^{(j)}_{mn}$ is a value obtained in a $j^{th}$ iterative decoding process in a semi-iterative decoding process, and denotes a message delivered from a check node m to a variable node n. In addition, $q^{(j)}_i$ denotes a message delivered from a variable node i to a check node m in a $j^{th}$ iterative decoding process. Here, 'i' denotes a value obtained by rear ranging variable nodes connected to a check node m from 0 to $d_c-1$. Therefore, for i=0, it means a variable node n.

$$q_{mn}^{(j+1)} = q_{mn}^{(0)} + \sum_{i=1}^{d_c-1} r_i^{(j)} \quad (34)$$

where $q_{mn}^{(j)}$ is a message from variable node $n$ to check node $m$ at the $j$th iteration and $q_{mn}^{(0)}$ is an initial message from channel reliability.

$r_i^{(j)}$ is a rearranged message incident to variable node $n$ with $r_0^{(j)} = r_{mn}^{(j)}$ at the $j$th iteration.

In Equation (34), $q^{(j+1)}_{mn}$ is a value obtained in a $j^{th}$ iterative decoding process, and denotes a message delivered from a variable node n to a check node m. Here, $r^{(j)}_i$ denotes a message delivered from a check node i to a variable node n in a $j^{th}$ iterative decoding process, and 'i' denotes a value obtained by rearranging check nodes connected to a variable node n from 0 to $d_v-1$. Therefore, for i=0, it means a check node m.

$$l_n^{(j+1)} = l_n^{(0)} + \sum_{i=0}^{d_c-1} r_i^{(j)} \quad (35)$$

where $l_n^{(j)}$ is an LLR output of coded symbol $n$ at the $j$th iteration and $l_n^{(0)}$ is an initial LLR output from channel reliability.

In Equation (35), $l^{(j+1)}_n$ denotes an LLR value defined for a variable node n in a $j^{th}$ iterative decoding process.

Figure 12:
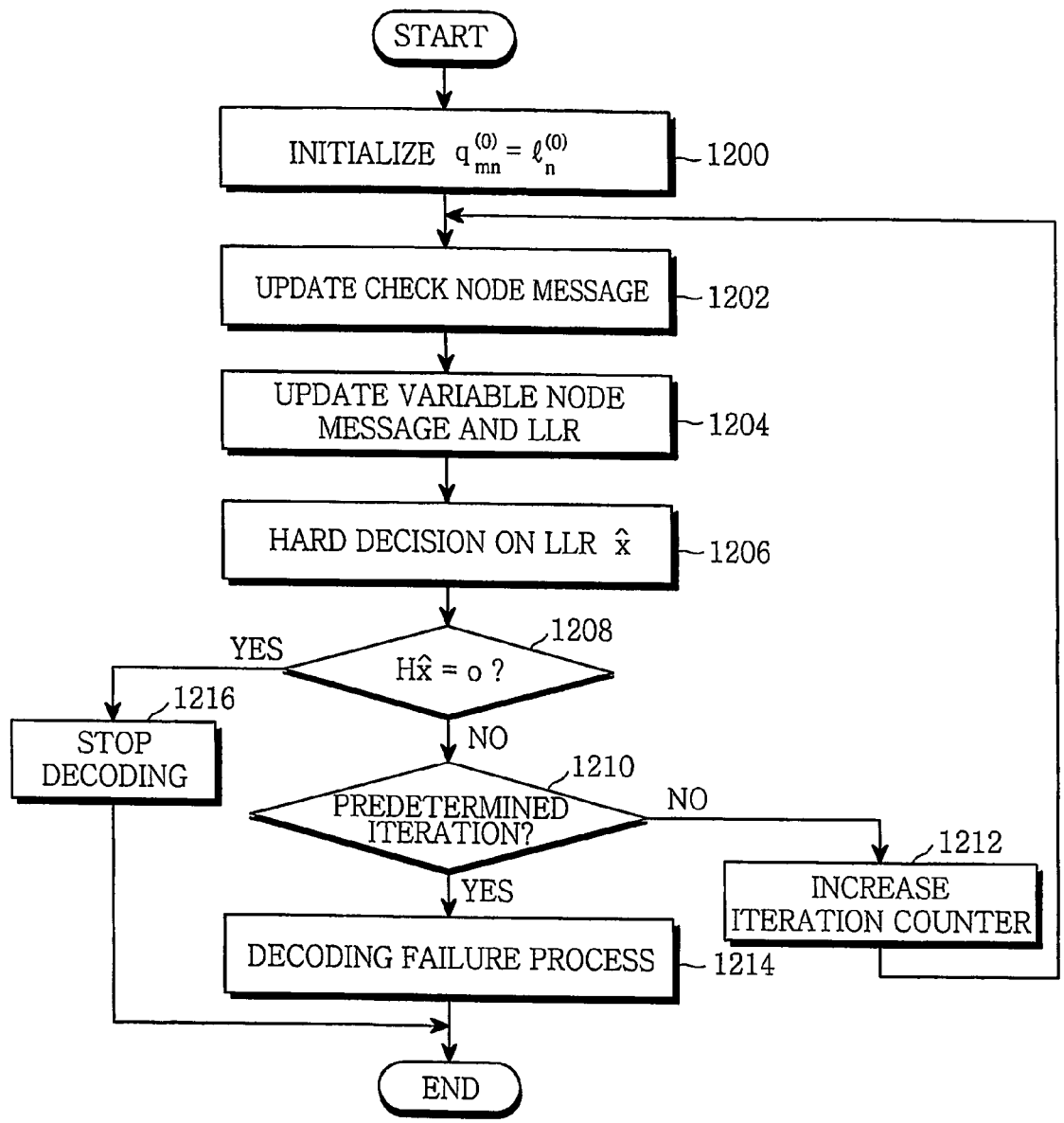
FIG. 12 is a flowchart illustrating an iterative belief propagation decoding process for proving efficiency of the present invention.

A description will now be made of an iterative belief propagation decoding process using the processes of Equation (33) to Equation (35). FIG. 12 is a flowchart illustrating an iterative belief propagation decoding process using Equation (33) to Equation (35).

FIG. 12 illustrates a process of decoding a received message in a receiver. Therefore, an initial message of a variable node n for a received message is defined as channel reliability of an $n^{th}$ symbol of a received codeword, and this can be expressed as $$q_{mn}^{(0)} = l_n^{(0)} \quad (36)$$

In Equation (36), $q_{mn}^{(0)}$ denotes an initial value of an initially-defined variable node message, and $1_n^{(0)}$ denotes an initial LLR value for an initially-defined variable node. In step 1200, an initial message is defined as channel reliability of an $n^{th}$ symbol of a received codeword as shown in Equation (36). Also, an iteration counter is reset. Thereafter, in step 1202, a message of a check node is updated in the method given by Equation (33). In step 1204, a variable node and a log likelihood ratio are updated. The message of a variable node is updated in the method of Equation (34), and the log likelihood ratio is updated in the method of Equation (35).

After the check node, variable node, and log likelihood ratio are all updated in the foregoing process, a value of the updated log likelihood ratio undergoes hard decision in step 1206. Thereafter, in step 1208, parity check is performed on a received message based on the hard-decided value. If the parity check result has a value of 0 meaning that decoding has been successfully performed, the decoding ends in step 1216. However, if the parity check result does not have a value of 0, it is determined in step 1210 whether iteration has reached a predetermined iteration number. If it is determined in step 1210 that iteration has reached the predetermined iteration number, a decoding failure process is performed in step 1214, determining that although decoding is performed additionally, there is low probability that the decoding will be achieved successfully. However, if it is determined in step 1210 that iteration has not reached the predetermined iteration number, the iteration counter is increased by 1 in step 1212, and then, the routine returns to step 1202.

B. Simulation Environment

An experimental environment for evaluating performance of a low-density parity check code constructed by a parity check matrix defined in the present invention is illustrated in Table 1.

TABLE 1

Code rate = ½, maximum variable node degree = 15
Offset (f) in Hp = 7
Frame size = 435(p = 29), 795 (p = 53), 1545(p = 103), 3855(p = 257)
Binary antipodal signaling over AWGN channel
Iterative belief propagation decoding
Floating point simulation
Maximum number of iterations = 160
Stop by parity check at each iteration
Frame error rate (FER) & information bit error rate (BER) evaluation For convenience, the present invention limits a code rate of a low-density parity check code to ½. However, parity check matrix design of a low-density parity check code for supporting various code rates can be discussed as a method for lifting a scheme proposed in the present invention according to a code rate. A maximum variable node degree is set to 15 in a factor graph of a low-density parity check code by a parity check matrix defined in the present invention, in order to acquire excellent performance and prevent a hardware size from increasing in implementation. An offset f in a matrix of a parity part $H_p$ is set to 7 in order to simply remove a length-4 cycle from a parity check matrix in the manner described in (III) of section C. A frame size of a low-density parity check code simulated in the present invention is set to a value similar to an encoder packet (EP) size specified in the cdma2000 1xEV-DV standard so that performance of the low-density parity check code is compared with performance of a turbo decoder currently used in the cdma2000 1xEV-DV standard. In a decoding process of a turbo code for performance comparison, a log-MAP algorithm is used, and the maximum number of iterations is limited to 8.

The maximum number of iterations of an iterative belief propagation decoder for a low-density parity check code is set to 160, taking into consideration the fact that a convergence speed of an irregular low-density parity check code is relatively low in the general density evolution technique. For experiments on the decoder, floating point simulation expressing extrinsic & LLR information in real values was performed. In a check node update process, in order to prevent overflow of a function $\phi(x)=-\log(\tanh(|x|/2))$, a value of $\phi(x)$ is limited to 20 for x in $|x|<10^{-8}$. A decoder for a low-density parity check code performs parity check at each iteration and adopts the parity check result as a stopping criterion, so that no error is detected in a parity check process. However, when an error occurs actually, the decoder classifies the defective frame as a frame having an undetected error. Finally, a frame error rate and a bit error rate are used as measures for evaluating performance of the low-density parity check code designed in the present invention. The frame/bit error is considered only when an error occurs in information symbols. A description will now be made of performance of the parity check code simulated in the foregoing simulation environment.

C. Simulation Results

Figure 13B:
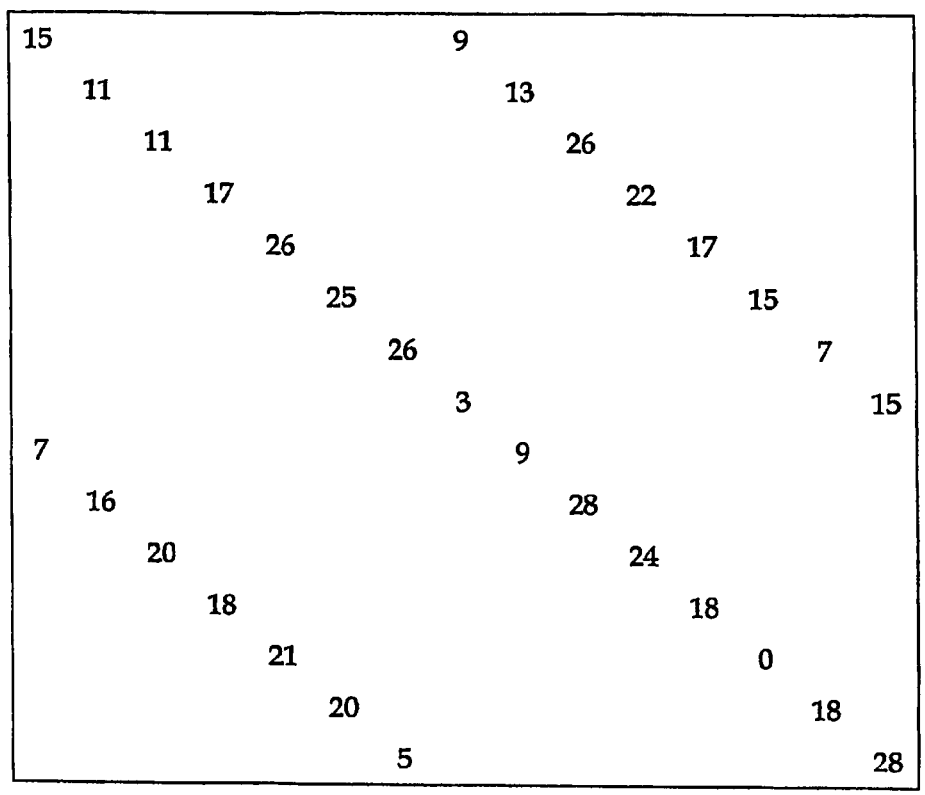
FIG. 13B is a diagram illustrating an example of a matrix of a parity part $H_p$ for n=870 and p=29.
Figure 13C:
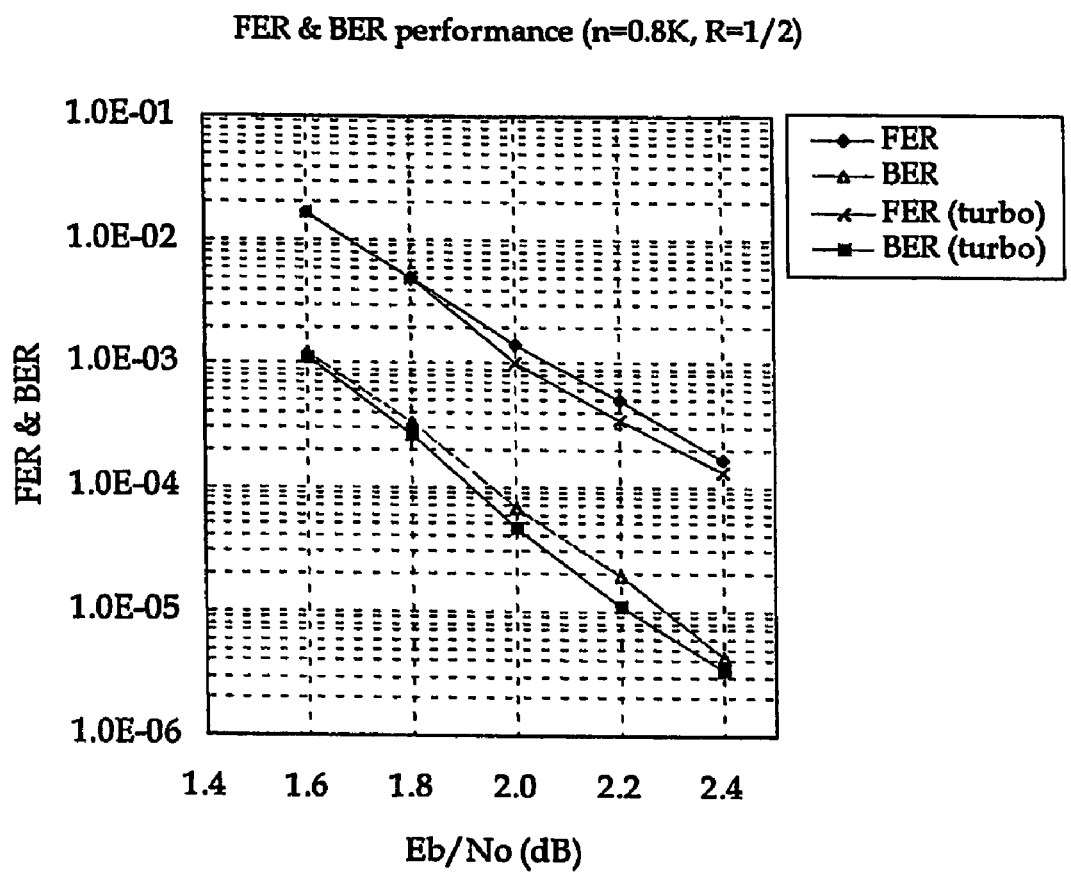
FIG. 13C is a simulation result graph illustrating a comparison between a low-density parity check code and a turbo code.

FIG. 13A is a diagram illustrating an example of a matrix of an information part $H_d$ for n=870 and p=29, FIG. 13B is a diagram illustrating an example of a matrix of a parity part $H_p$ for n=870 and p=29, and FIG. 13C is a simulation result graph illustrating a comparison between a low-density parity check code and a turbo code.

The matrix of an information part and the matrix of a parity part illustrated in FIGS. 13A and 13B are constructed in the foregoing method according to the present invention, and actually, the two matrixes are concatenated before being encoded. A description will now be made of the conditions for a case where the performances illustrated in FIG. 13C are available. For performance comparison between two coding methods, performance for a case where an encoder packet (EP) size of the cdma2000 1xEV-DV standard is 408 and a code rate is ½ is shown together. As illustrated in FIG. 13C, it can be understood that for a small block size, performance of a turbo code used in the cdma2000 1xEV-DV standard is slightly superior to performance of the low-density parity check code proposed in the present invention in terms of both a frame error rate (FER) and a bit error rate (BER). This shows that a parity check matrix construction defining the low-density parity check code defined in the present invention is not an optimized construction in terms of decoding performance of a codeword with a small size. That is, it can be noted that when a coded-block size of a low-density parity check code is small, in order for the low-density parity check code to show better performance as compared with the existing known turbo code, an optimization operation on the parity check matrix should be performed further. However, it is shown that the low-density parity check code is superior to the turbo code in terms of decoding performance of a codeword with a large block size.

Table 2 illustrates the average number of iterations for each Eb/No for n=870. According to Table 2, although a maximum of 160 iterations are performed on a given low-density parity check code, an actual decoding result shows that it is possible to obtain sufficient performance with only less than 10 iterations considering a high SNR within 20 iterations.

TABLE 2

| Eb/No (dB) | Average number of iterations |
|---|---|
| 1.6 | 15.085 |
| 1.8 | 11.353 |
| 2.0 | 9.317 |
| 2.2 | 8.01 |
| 2.4 | 7.087 |

Figure 14B:
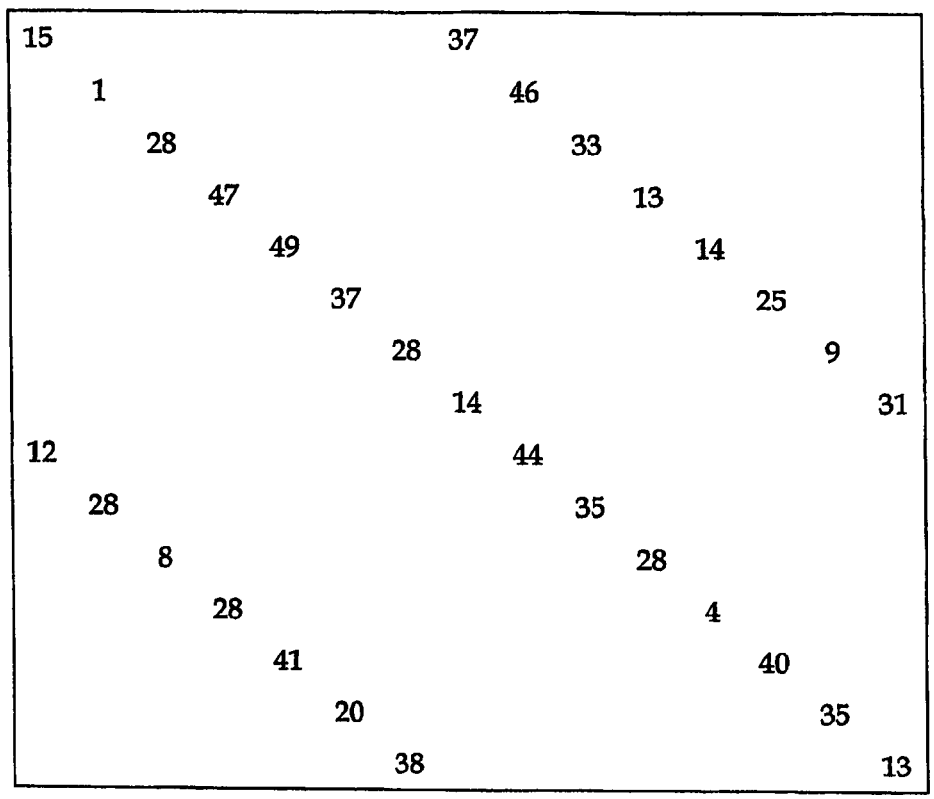
FIG. 14B is a diagram illustrating an example of a matrix of a parity part $H_p$ for n=1590 and p=53.
Figure 14C:
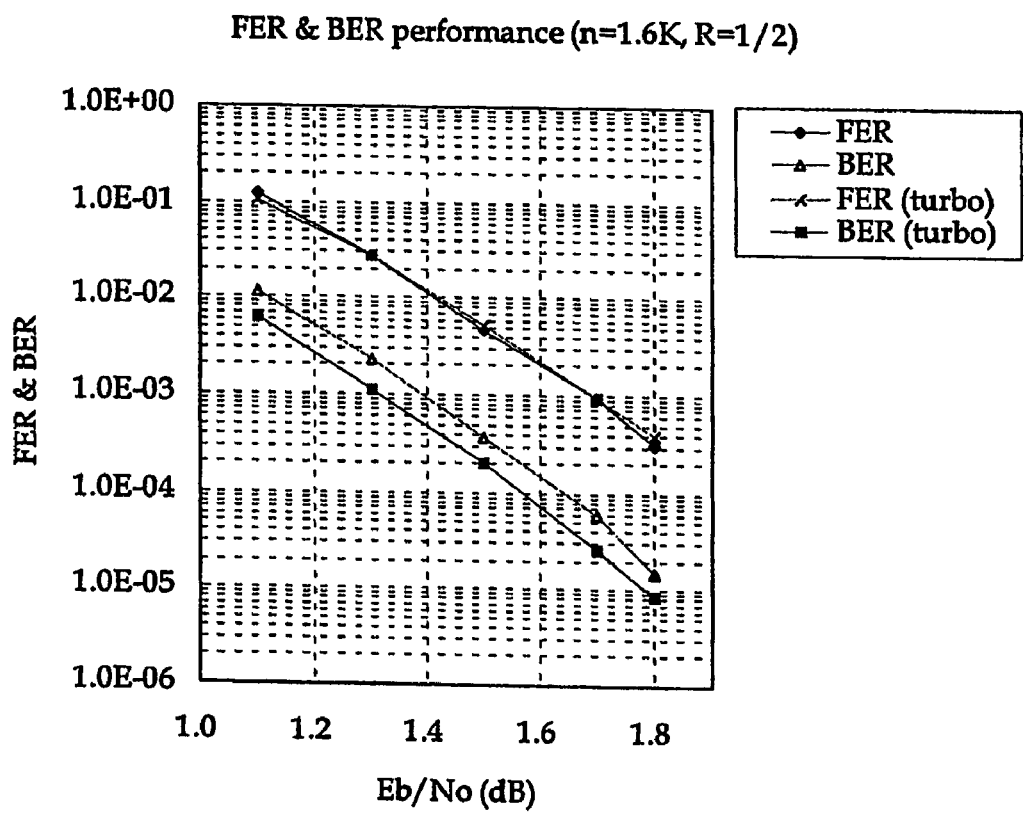
FIG. 14C is a simulation result graph illustrating a comparison between a low-density parity check code and a turbo code.

FIG. 14A is a diagram illustrating an example of a matrix of an information part $H_d$ for n=1590 and p=53, FIG. 14B is a diagram illustrating an example of a matrix of a parity part $H_p$ for n=1590 and p=53, and FIG. 14C is a simulation result graph illustrating a comparison between a low-density parity check code and a turbo code.

The matrix of an information part and the matrix of a parity part illustrated in FIGS. 14A and 14B are constructed in the foregoing method according to the present invention, and actually, the two matrixes are concatenated before being encoded.

A description will now be made of the conditions for a case where the performances illustrated in FIG. 14C are available. For performance comparison between two coding methods, performance for a case where an encoder packet size of the cdma2000 1xEV-DV standard is 792 and a code rate is ½ is shown together. It is noted from FIG. 14C that as a block size of a low-density parity check code increases, the low-density parity check code is almost equal to the existing turbo code in frame error rate. However, the low-density parity check code is still inferior to the existing turbo code in bit error rate. This is because the turbo code is lower than the low-density parity check code in terms of the ratio of bit errors existing in a defective frame of the turbo code. That is, the turbo code is lower than the low-density parity check code in BER/FER for the same Eb/No. In this case, it means that the turbo code is lower than the low-density parity check code in average number of bit errors existing in a defective frame. However, in an actual wireless communication system employing Hybrid Automatic Retransmission Request (ARQ), because it is more preferable that FER performance is superior to BER performance, it can be considered from FIG. 14C that for n=1590, the low-density parity check code according to the present invention is equal in performance to the turbo code used in the cdma2000 1xEV-DV standard.

Table 3 illustrates the average number of iterations for each Eb/No for n=1590. As a block size increases, the average number of iterations is slightly higher than that in Table 2. However, it can be understood that at a sufficiently high SNR, sufficiently high performance can be obtained with only less than 20 iterations.

TABLE 3

| Eb/No (dB) | Average number of iterations |
|---|---|
| 1.1 | 40.308 |
| 1.3 | 21.504 |
| 1.5 | 14.858 |
| 1.7 | 12.018 |
| 1.8 | 11.020 |

Figure 15B:
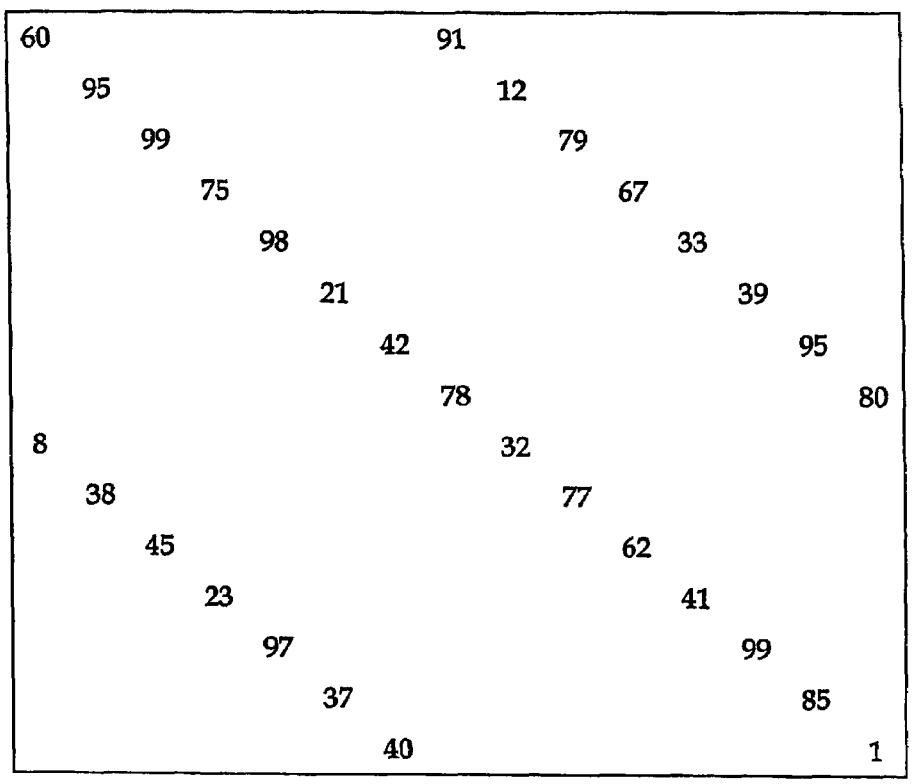
FIG. 15B is a diagram illustrating an example of a matrix of a parity part $H_p$ for n=3090 and p=103.
Figure 15C:
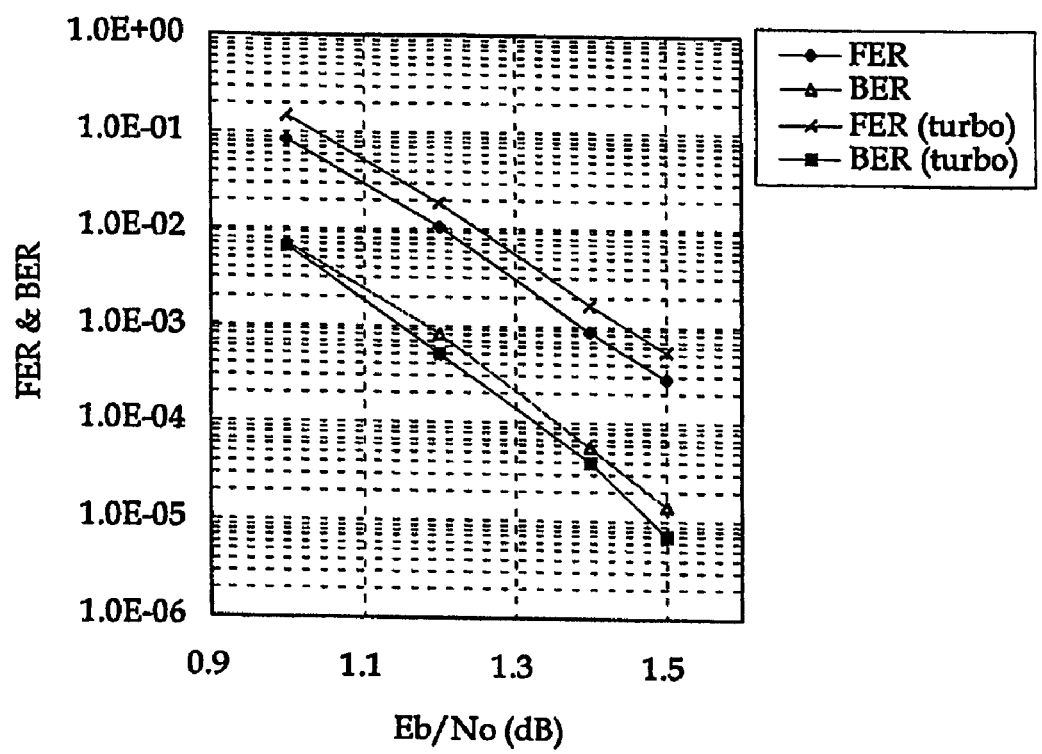
FIG. 15C is a simulation result graph illustrating a comparison between a low-density parity check code and a turbo code.

FIG. 15A is a diagram illustrating an example of a matrix of an information part $H_d$ for n=3090 and p=103, FIG. 15B is a diagram illustrating an example of a matrix of a parity part $H_p$ for n=3090 and p=103, and FIG. 15C is a simulation result graph illustrating a comparison between a low-density parity check code and a turbo code.

The matrix of an information part and the matrix of a parity part illustrated in FIGS. 15A and 15B are constructed in the foregoing method according to the present invention, and actually, the two matrixes are concatenated before being encoded.

A description will now be made of the conditions for a case where the performances illustrated in FIG. 15C are available. For performance comparison between two coding methods, performance for a case where an encoder packet size of the cdma2000 1xEV-DV standard is 1560 and a code rate is ½ is shown together. It is noted from FIG. 15C that as a block size of a low-density parity check code increases, the low-density parity check code is superior to the existing turbo code with a similar size in frame error rate. Although the low-density parity check code is still inferior to the existing turbo code in bit error rate as illustrated in FIG. 14C, a difference between them is greatly reduced, closely approximating performance of the turbo code.

Table 4 illustrates the average number of iterations for each Eb/No for n=3090. As a block size increases, the average number of iterations is slightly higher than that in Table 2. However, it can be understood that at a sufficiently high SNR, sufficiently high performance can be obtained with only less than 20 iterations.

TABLE 4

| Eb/No (dB) | Average number of iterations |
|---|---|
| 1.1 | 38.495 |
| 1.2 | 22.051 |
| 1.4 | 16.190 |
| 1.5 | 14.623 |

Figure 16C:
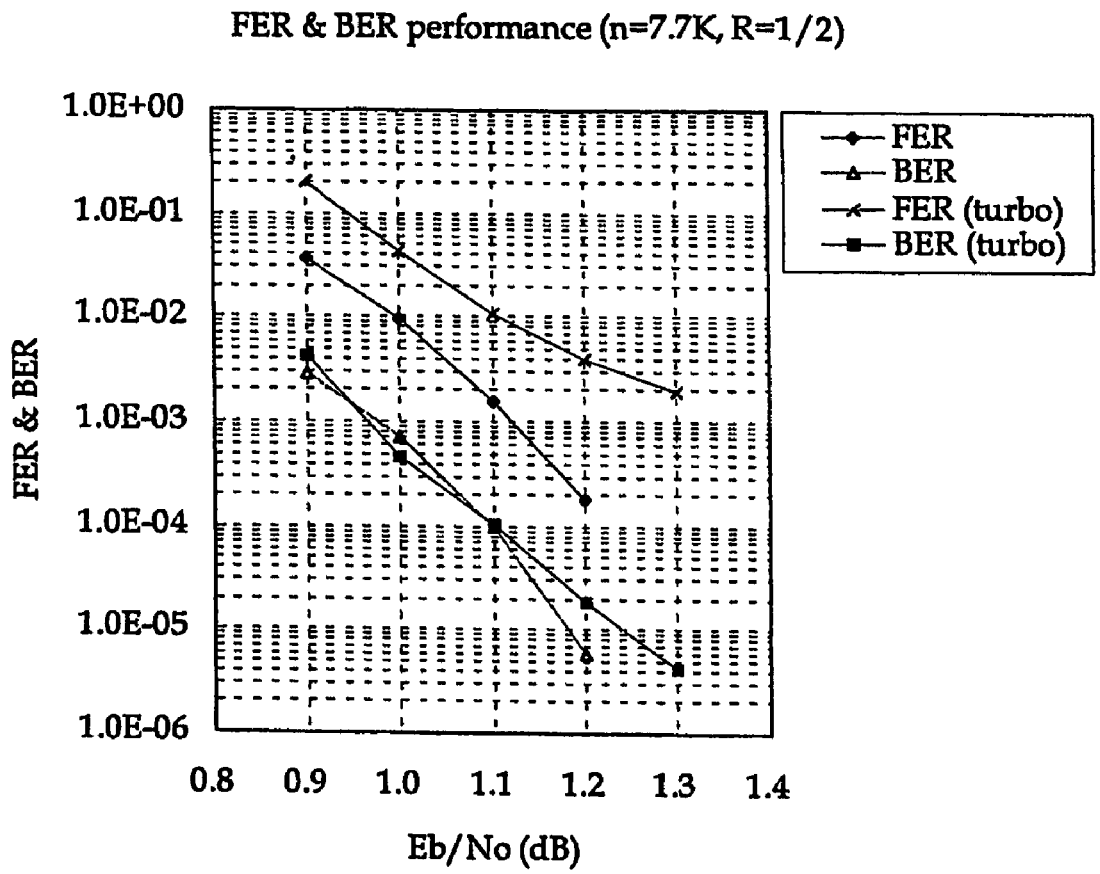
FIG. 16C is a simulation result graph illustrating a comparison between a low-density parity check code and a turbo code.
Figure 16D:
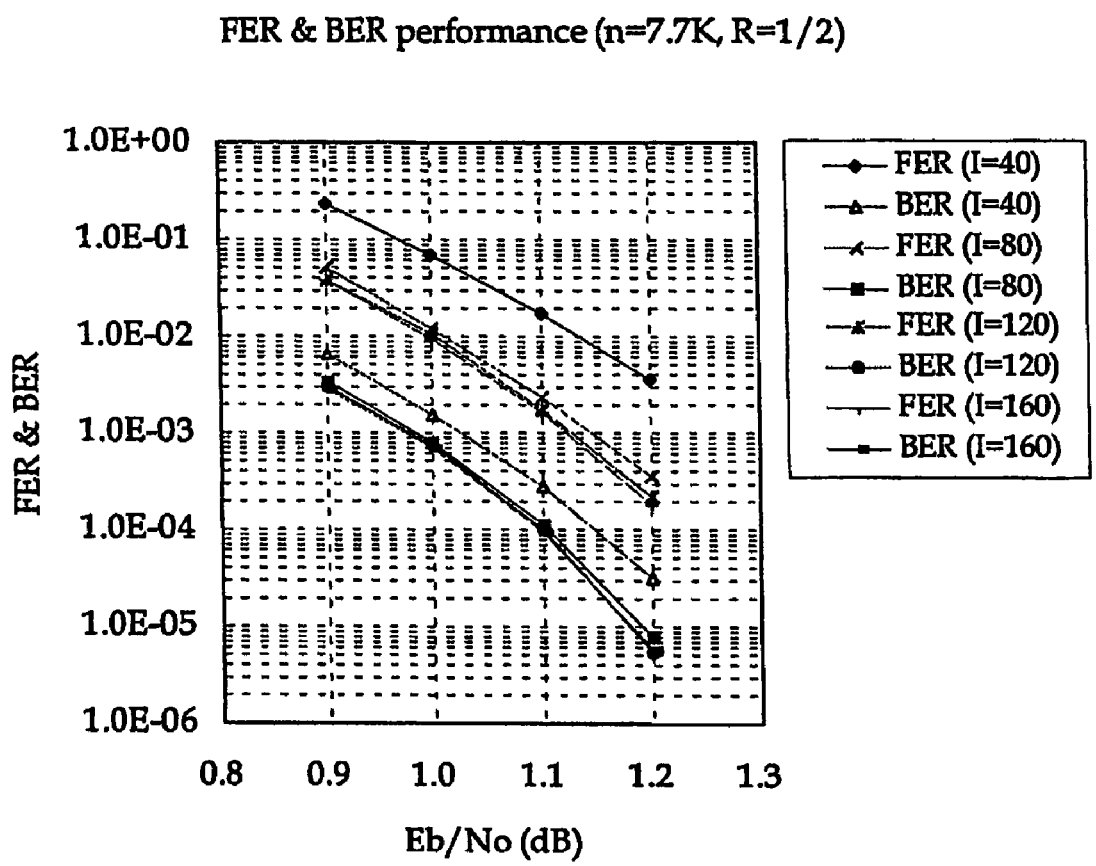
FIG. 16D is a simulation result graph for a low-density parity check code according to a variation in the number of iterations.

FIG. 16A is a diagram illustrating an example of a matrix of an information part $H_d$ for n=7710 and p=257, FIG. 16B is a diagram illustrating an example of a matrix of a parity part $H_p$ for n=7710 and p=257, FIG. 16C is a simulation result graph illustrating a comparison between a low-density parity check code and a turbo code, and FIG. 16D is a simulation result graph for a low-density parity check code according to a variation in the number of iterations.

The matrix of an information part and the matrix of a parity part illustrated in FIGS. 16A and 16B are constructed in the foregoing method according to the present invention, and actually, the two matrixes are concatenated before being encoded.

A description will now be made of the conditions for a case where the performances illustrated in FIG. 16C are available. For performance comparison, performance for a case where an encoder packet size of the cdma2000 1xEV-DV standard is 3864 and a code rate is ½ is shown together. It is noted from FIG. 16C that when a block size of a low-density parity check code is very large, the low-density parity check code is very superior to the turbo code with a similar size in performance. In particular, it can be understood that in the case of a turbo code with a frame length of 3864 used in the cdma2000 1xEV-DV standard, both a frame error rate and a bit error rate have an error floor at a high SNR. However, it is observed that in the case of the low-density parity check code defined in the present invention, such an error floor does not occur. Such performance is very advantageous to a communication system employing H-ARQ. Accordingly, it can be noted that the low-density parity check code defined in the present invention is very superior in performance to the turbo code used in the existing standard. Table 5 illustrates the average number of iterations for each Eb/No for n=7710.

TABLE 5

| Eb/No (dB) | Average number of iterations |
|---|---|
| 0.9 | 41.036 |
| 1.0 | 31.034 |
| 1.1 | 25.507 |
| 1.2 | 22.170 |

In Table 5, as a block size of the low-density parity check code increases, the average number of iterations increases at high rate as compared with that of Table 4. That is, the low-density parity check code supporting a maximum frame size similar to the size defined in the cdma2000 1xEV-DV standard requires 20 or more iterative decodings even at a high SNR. Therefore, in order to show optimal performance with minimum delay, it is necessary to observe performance of an LDPC decoder according to the number of iterations.

FIG. 16C is a diagram illustrating available FER/BER performance of the low-density parity check code having the constructions shown in FIGS. 16A and 16B in which the maximum number of iterations is limited to 40, 80, 120 and 160. Unlike this, if the maximum number of iterations is limited to 40, 80 and 120, slight performance deterioration occurs. However, except the case where the maximum number of iterations is limited to 40, the performance deterioration is not considerable. Therefore, although the maximum number of iterations is limited to about 80, the performance deterioration problem is not considerable. In particular, when a block size is smaller than this, the performance deterioration caused by limiting the maximum number of iterations to 80 is further reduced, so that it becomes ignorable. Therefore, the low-density parity check code proposed in the present invention can obtain sufficient performance during decoding, if the maximum number of iterations is set to about 80, on the assumption that the maximum block size is 7710.

3. Conclusion

The present invention defines a low-density parity check code capable of enabling efficient encoding and obtaining excellent decoding performance only for a code rate=½. To this end, the present invention partitions a parity check matrix defining a low-density parity check code into two parts, and defines a part corresponding to information on a codeword in the parity check matrix using an array code structure whose column weight is higher than 2. In addition, the present invention defines a part corresponding to a parity of a codeword in the parity check matrix as a generalized dual-diagonal matrix whose column weights are all 2. The parity check matrix defined in this manner generates an irregular low-density parity check code whose maximum variable node degree $d_v$=15, in which a threshold for error free is 0.9352 in an AWGN channel by the density evolution technique based on Gaussian approximation. This shows performance approximating Shannon channel capacity by 0.5819 dB for a rate-½ code.

Based on the fact that linear encoding is available, once a parity check matrix is designed in a random scheme without considering possibility of actual linear encoding, an excellent low-density parity check code approximating the Shannon threshold by 0.5819 dB or closer can be generated. In this case, the encoding process becomes complicated, making it difficult to enable actual implementation. Because enabling linear encoding serves as one restrictive condition for a parity check matrix defining a low-density parity check code, the parity check matrix should have a random structure. Therefore, a possibility for showing excellent performance will be lower than that of a parity check matrix that is randomly defined without considering linear encoding. Thus, application of the present invention shows relatively excellent performance considering the linear encoding. That is, the present invention shows relatively excellent performance despite a restriction on the parity check matrix due to the linear encoding.

In order to show excellent decoding performance, a size of a codeword is increased and a maximum variable node degree is increased accordingly in defining a degree distribution of a parity check matrix, making it possible to design a low-density parity check code having performance approximating the Shannon capacity limit. However, in this case, because an increase in the maximum variable node degree increases complexity of the decoder during decoding, it cannot contribute to actual implementation. Therefore, that decoder complexity is allowable means that a reasonable maximum variable node degree is set in implementation.

The low-density parity check code by a parity check matrix defined in the present invention has a generalized dual-diagonal matrix in which a parity part of a codeword in the parity check matrix is lifted by cyclic permutation of a p×p identity matrix. Therefore, it can be simply encoded by simple linear calculations. In addition, when decoding performance by iterative belief propagation was compared with decoding performance of the turbo code used in the cdma2000 1xEV-DV standard, it was proven through simulations that a lower frame error rate can be obtained for the similar frame size. In particular, compared with the turbo code, the low-density parity check code according to the present invention has a lower frame error rate, and when it is used together with the Hybrid—ARQ technique, it will serve as a point of excellence. Therefore, the low-density parity check code defined in the present invention can be simply encoded by simple linear calculations. Also, in implementation of the decoder, check node processors and variable node processors are implemented in parallel in rows and columns of respective submatrixes, thereby enabling fast decoding.

In the low-density parity check code defined in the present invention, it can be simply checked that there is no length-4 cycle in a factor graph defining the low-density parity check code according to a characteristic of arrangement of the submatrixes constituting a parity check matrix.

As described above, application of the present invention can provide performance similar to or superior to that of the turbo decoder, and in particular, can generate a low-density parity check code capable of reducing a frame error rate. In addition, the low-density parity check code according to the present invention can reduce decoding complexity.

What is claimed is:

1. A method for generating a Low Density Parity Check (LDPC) code consisting of an information-part matrix and a parity-part matrix in a LDPC code generator, comprising the steps of:
   changing the information-part matrix to an array code structure, and allocating a degree sequence to each of submatrix columns;
   extending the parity-part matrix such that an offset value between diagonal lines has a predetermined value in a generalized dual-diagonal matrix which is the parity-part matrix;
   lifting the generalized dual-diagonal matrix;
   determining an offset value for cyclic column shift for each submatrix of the lifted generalized dual-diagonal matrix; and
   performing an encoding process for determining a parity symbol corresponding to a column of the parity-part matrix.

2. The method of claim 1, wherein the degree sequence is formed in accordance with Equation (37);

$$D=\{15,15,15,5,5,5,4,3,3,3,3,3,3,3\} \quad (37).$$

3. The method of claim 1, wherein the offset value between diagonal lines is relatively prime to the number of columns in the generalized dual-diagonal matrix.

4. The method of claim 1, wherein the number of rows in the submatrix is a prime number.

5. The method of claim 1, wherein a difference between a sum of offset values for cyclic row shift of a submatrix on a diagonal line in a generalized dual-diagonal matrix which is the parity-part matrix and a sum of offset values for cyclic row shift of a submatrix on an offset diagonal line is not 0.

6. The method of claim 1, wherein the encoding process comprises the process of:
   (a) determining a parity symbol of a first row in a submatrix with a submatrix column index 0 on a diagonal line of the parity-part matrix;
   (b) setting a row index in a submatrix of a parity symbol being identical to the determined parity symbol in column index in a submatrix in a submatrix on an offset diagonal line having the same submatrix column index as the submatrix column index of the set parity symbol;
   (c) determining a parity symbol having the same row index in the set submatrix in a submatrix on a diagonal line having the same submatrix row index as the submatrix row index of the submatrix on the offset diagonal line; and
   (d) repeatedly performing the steps (b) and (c) until generation of the parity matrix is completed.

7. The method of claim 6, wherein in step (a), the parity symbol is determined by a sum of information symbols of the information-part matrix existing in the same row as a row index in the submatrix whose parity symbols are determined.

8. The method of claim 6, wherein in step (b), the row index in the submatrix is set in accordance with Equation (38);

$$y^{(2)}_{i+(r-f)} = x^{(1)}_i - j_{2(i+(r-f))+1} \quad (38)$$

where $v^{(2)}_{i+(r-f)}$ denotes a row index in a submatrix with a submatrix column index i on an offset diagonal line, $x^{(1)}_i$ denotes a column index in a submatrix with a column index i existing in a diagonal line, and $j2(i+(r-f))+1$ denotes an offset value for cyclic column shift of a submatrix with a submatrix column index i on the offset diagonal line.

9. The method of claim 6, wherein in step (c), the parity symbol is determined in accordance with Equation (39);

$$P^{(1)}_{x_{i+(r-f)}} = P^{(1)}_{x_i} + v^{(2)}_{y_{i+(r-f)}} \quad (39)$$

where $P^{(1)}_{x_{i+(r-f)}}$ denotes a parity symbol corresponding to x(1)i+(r-f), $P^{(1)}_{x_i}$ denotes a parity symbol corresponding to a column index x(1)i, and $v^{(2)}_{y_{i+(r-f)}}$ denotes a sum of information symbols existing in a row with a row index y(2)i+(r-f) in a submatrix with a submatrix column index i+(r-f).

* * * * *